United States Patent
Fukao et al.

[11] Patent Number: 6,156,639
[45] Date of Patent: Dec. 5, 2000

[54] METHOD FOR MANUFACTURING CONTACT STRUCTURE

[75] Inventors: Tetsuhiro Fukao; Yoshihiro Kusumi; Hiroshi Miyatake; Nobuo Fujiwara; Shigenori Sakamori; Satoshi Iida, all of Tokyo, Japan

[73] Assignee: Mitsubishi Denki Kabushiki Kaisha, Tokyo, Japan

[21] Appl. No.: 09/116,340

[22] Filed: Jul. 16, 1998

[30] Foreign Application Priority Data

Feb. 16, 1998 [JP] Japan .................................. 10-032925

[51] Int. Cl.$^7$ .................................................. H01L 21/4763
[52] U.S. Cl. ............................ 438/629; 438/672; 256/763
[58] Field of Search ..................................... 438/628, 629, 438/648, 672, 683, 706; 257/763, 764, 765

[56] References Cited

U.S. PATENT DOCUMENTS 5,714,804  2/1998  Miller et al. ............................. 257/763

FOREIGN PATENT DOCUMENTS

| 7-37979 | 2/1995 | Japan . |
| 7-50298 | 2/1995 | Japan . |
| 9-172017 | 6/1997 | Japan . |
| 9-232430 | 9/1997 | Japan . |

*Primary Examiner*—David Nelms
*Assistant Examiner*—Quoc Hoang
*Attorney, Agent, or Firm*—Oblon, Spivak, McClelland, Maier & Neustadt, P.C.

[57] ABSTRACT

Provided are a method for manufacturing contact structure to prevent, in the wire of a borderless structure, erosion in the contact area between the wire and a conductor. An interlayer insulating film (300) having a wire burying hole is formed and a conductor (400) is buried in the hole. Then, a wire layer (500) covering the hole is formed on the interlayer insulating film (300). The wire layer (500) is made so as to have a borderless structure by using a resist (540) as a mask. A barrier metal layer (510) suppresses erosion in the contact area between the conductor (400) and the wire layer (500).

13 Claims, 37 Drawing Sheets

METHOD FOR MANUFACTURING CONTACT STRUCTURE

BACKGROUND OF THE INVENTION

1. Field of the Invention

The present invention relates to a semiconductor integrated circuit (contact structure) and a manufacturing method thereof and, in particular, to a wire of a borderless structure.

2. Description of the Background Art

In recent years, a wire of a borderless structure has been employed along with the refinement of semiconductor integrated circuits. Hereinafter, aluminum alloys containing about 0.5% of aluminum or copper are referred to as "aluminum." In a borderless structure, a wire formed on an interlayer insulation film having a wire burying hole, is in contact with a conductor in the hole, with part of the hole not covered.

A method of manufacturing wires of conventional borderless structures is described by referring to FIGS. 52 and 53. In the structure shown in FIG. 52, an underlying wire layer 920, an interlayer insulation film 930 having a wire burying hole 931, a barrier metal layer 941, a tungsten plug 942, an aluminum wire layer 952, an antirellection layer 953, and a resist 954, are disposed on a base layer 910. The base layer 910 is a semiconductor substrate on which an element and the like are formed, or is an interlayer insulation film formed on a semiconductor substrate. The metal formed above the interlayer insulation film 930 is defined as a wire layer 950, and the metal in the wire burying hole 931 is defined as a conductor 940. The aluminum wire layer 952 is in contact with the tungsten plug 942. By using the resist 954 as a mask, the wire layer 950 is subjected to an etching, resulting in a wire of a borderless structure, as shown in FIG. 53.

The upper portion of the conductor 940, however, comprises the aluminum wire layer 952, and the contact area between the aluminum wire layer 952 and the tungsten plug 942 is exposed by the etching. Furthermore, it was found experimentally that an echant enters the contact area between the aluminum wire layer 952 and the tungsten plug 942 to cause a side etch and leads to the erosion of the aluminum wire layer 952 in this area. A pronounced clearance 970 due to the erosion of the aluminum wire layer 952 may generate a clearance 970 between the conductor 940 and the wire layer 950, causing disconnection of the wire.

SUMMARY OF THE INVENTION

According to a first aspect of the present invention, a method for manufacturing a contact structure comprises the steps of: (a) forming an insulating film having a wire burying hole; (b) forming a conductor buried in the wire burying hole; (c) forming a wire layer covering the wire burying hole, on the insulting film; and (d) trimming the wire layer by etching so that it does not cover part of the wire burying hole, wherein an erosion inhibitor for inhibiting erosion of the wire layer is formed in a contact area between the conductor and the wire layer.

According to a second aspect, the method of the first aspect is characterized in that the conductor includes a tungsten plug and the wire layer includes an aluminum wire layer.

According to a third aspect, the method of the second aspect further comprises step (e), between the steps (b) and (c), of forming a metal layer composed of a metal other than aluminum on the conductor, as the erosion inhibitor.

According to a fourth aspect, the method of the third aspect is characterized in that the metal layer composed of metal other than aluminum is composed of tungsten.

According to a fifth aspect, the method of the second aspect further comprises step (e) of conducting a heat treatment for a structure obtained after the step (c), to form a region in which the conductor and the wire layer are mutually diffused, as the erosion inhibitor.

According to a sixth aspect, the method of the second aspect further comprises step (e), between the steps (a) and (b), of removing a surface of the insulating film so that a top end of the conductor is located above a top surface of the insulating film, wherein the erosion inhibitor is part of the conductor projecting from a top surface of the insulting film.

According to a seventh aspect, the method of the second aspect is characterized in that the step (a) includes step (e) of removing a surface of the conductor so that a top end of the conductor is located below a top surface of the insulating film; and the erosion inhibitor is the wire layer filled in the wire burying hole.

According to an eight aspect, the method of the second aspect is characterized in that the step (d) includes step (e) of forming another wire layer parallel to the wire layer, as the erosion inhibitor; and a wire interval between the wire layer and the aforementioned another wire layer is the shortest on a semiconductor integrated circuit on which the contact structure is provided.

According to a ninth aspect, the method of the second aspect is characterized in that the step (d) includes step (e) of forming a dummy wire parallel to the wire layer, as the erosion inhibitor.

According to a tenth aspect, the method of the second aspect is characterized in that the step (d) includes step (e) of forming another wire layer parallel to the wire layer, as the erosion inhibitor; and the etching includes two types of etchings for the longest wire interval, one of which has a higher etching rate and the other has a lower etching rate, than an etching rate in the shortest wire interval.

According to an eleventh aspect, the method of the second aspect is characterized in that the step (d) includes step (e) of forming another wire layer parallel to the wire layer, as the erosion inhibitor; and the etching comprises an etching using an etching gas that contains nitrogen, and an etching whose etching rate in the longest wire interval is higher than an etching rate in the shortest wire interval.

In the first aspect of the present invention, in order to solve the problem that in making the so-called borderless structure the contact area between a conductor and a wire layer is exposed and it becomes smaller than a wire burying hole, and therefore, if such an interface is eroded, it is liable to cause disconnection between the conductor and the wire layer, there is formed an erosion inhibitor for suppressing erosion due to etching to suppress the interface between the conductor and the wire layer from being eroded, thereby preventing disconnection therebtween.

In the second aspect, since erosion tends to occur when a tungsten plug is in contact with an aluminum wire layer, it is particularly effective for the cases where a tungsten plug is included as a conductor and an aluminum wire layer is employed as a wire layer.

In the third aspect, since a metal layer composed of a metal other than aluminum is formed between a conductor and a wire layer, a tungsten plug does not come into contact with an aluminum containing wire, thereby preventing erosion during etching.

In the fourth aspect, it is possible to prevent a complete disconnection between a wire layer and a conductor due to etching because the contact area between the wire layer and the conductor is increased even when a metal layer is composed of tungsten, instead of aluminum.

In the fifth aspect, since tungsten and aluminum are mutually diffused between a conductor and a wire layer, erosion due to etching can be prevented more satisfactorily compared to the cases where an aluminum wire layer is in contact with a tungsten plug.

In the sixth aspect, since the contact area between a conductor and a wire layer is increased, it is possible to completely prevent disconnection between the wire layer and the conductor due to etching.

In the seventh aspect, the top end of a conductor is located above the top surface of an insulating film, and a wire layer is formed below the top end of the conductor, so that part of the wire layer is filled in a wire burying hole. This causes no exposure between the conductor and the wire layer, preventing erosion therebetween.

In the eighth aspect, since in a borderless structure a wire layer has the shortest wire interval, erosion in the contact area between a conductor and a wire layer is more suppressed than the portions in a long wire interval.

In the ninth aspect, the formation of a dummy wire shortens a wire interval, to prevent erosion in the contact area between a conductor and a wire layer.

In the tenth aspect, etching for the longest wire interval is conducted at two different etching rates, one of which is higher and the other is lower than that in the shortest wire interval. Therefore, the removal of a wire layer by etching in the longest wire interval and that in the shortest wire interval can be conducted at the same time, to prevent erosion in the contact area between a conductor and a wire layer.

In the eleventh aspect, with an etching using gas containing nitrogen, the removal in a long wire interval is completed earlier than that in a short wire interval. However, until the removal in the short wire interval is completed, a strong side wall protection film remains on the side walls of a wire layer, thus suppressing erosion in the contact area between a conductor and the wire layer.

It is accordingly a primary object of the present invention to provide a semiconductor integrated circuit (contact structure) and a manufacturing method thereof which are directed to prevent, in the wire of a borderless structure, erosion of the contact area between a conductor and the wire.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A method for manufacturing a contact structure according to a first preferred embodiment of the present invention is described by referring to FIGS. 1 to 9.

Figure 1:
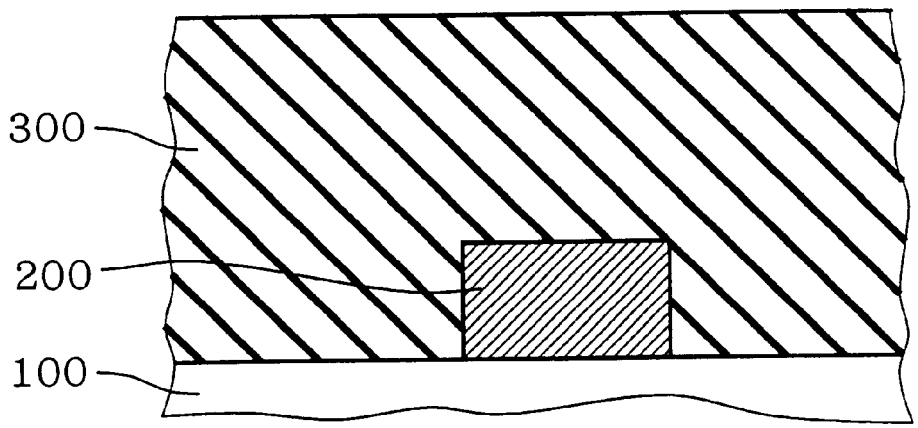
FIGS. 1 to 8 are cross-sectional views showing a sequence of steps in a method for manufacturing a contact structure according to a first preferred embodiment of the present invention.

Referring to FIG. 1, reference numeral 100 designates a base layer that is a semiconductor substrate on which an element and the like are formed, or is an interlayer insulation film formed on a semiconductor substrate. An underlying wire 200 is formed on the base layer 100. An interlayer insulation film 300 is formed on the base layer 100 and the underlying wire 200 by a plasma CVD (Chemical Vapor Deposition). The interlayer insulation film 300 is, for example, TEOS (Tetra Ethyl Orth Silicate).

Figure 2:
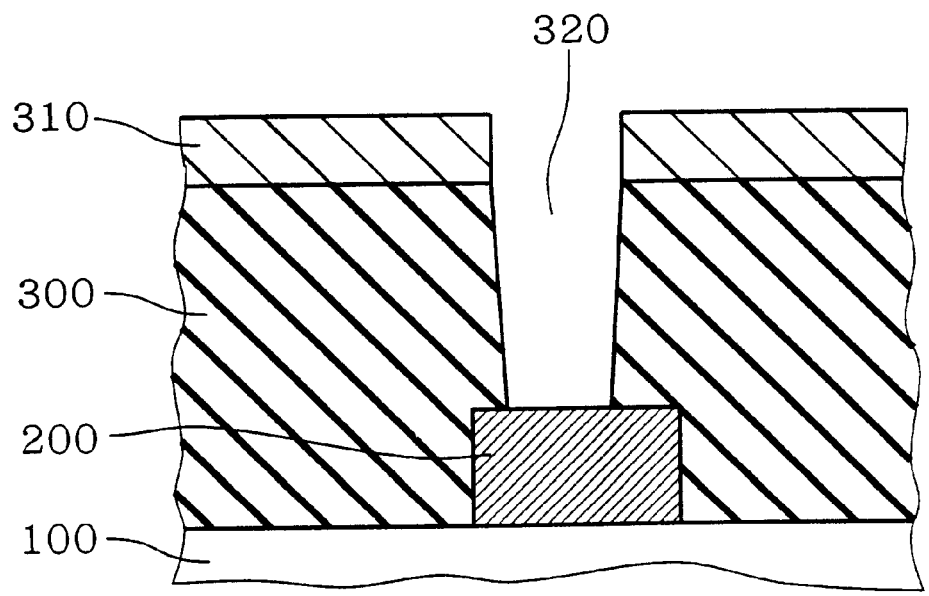

Referring to FIG. 2, a resist 310 is formed on the structure shown in FIG. 1, by using a known technique, and a patterning is conducted so that an opening is formed above the underlying wire 200. By using the resist 310 as a mask, a dry etching using a mixed gas plasma of $C_4F_8$ and $O_2$ is conducted to provide a wire burying hole 320 in the interlayer insulation film 300. The wire burying hole 320 is a contact hole or a via hole, having a bottom on which the underlying wire 200 is exposed.

Figure 3:
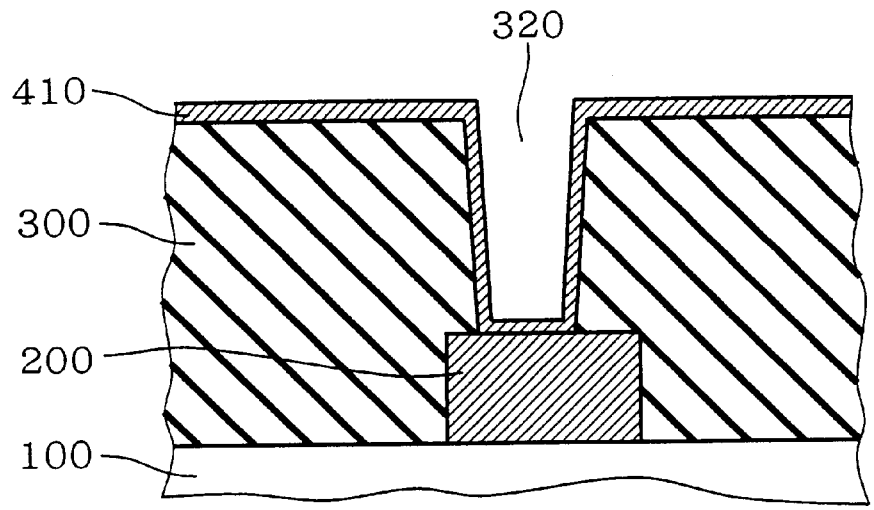

Referring to FIG. 3, a barrier metal layer 410 comprising a Ti layer in the lower part and a TiN layer in the upper part is formed on the structure after the resist 310 is removed. Here, the film thicknesses of the Ti layer and the TiN layer are 20 nm and 70 nm, respectively.

Figure 4:
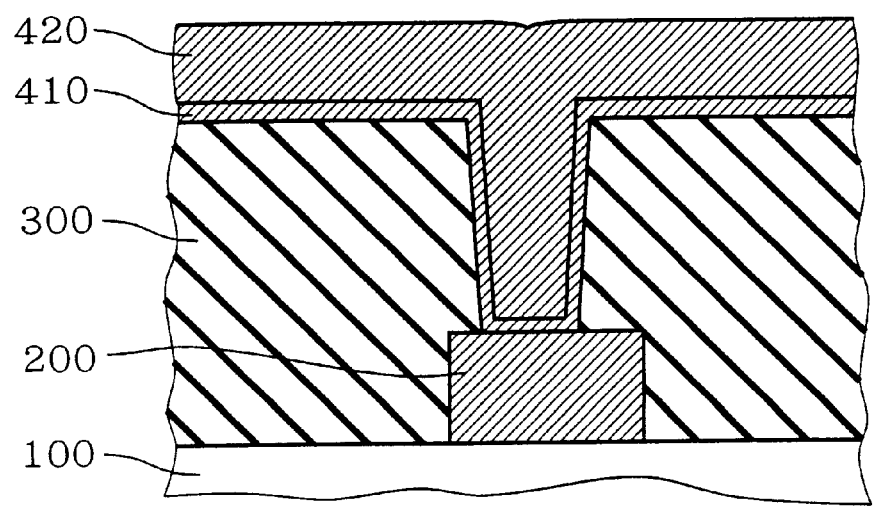

Referring to FIG. 4, a tungsten layer 420 is formed on the structure shown in FIG. 3, so that it fills the wire burying hole 320 and covers the barrier metal layer 410.

Figure 5:
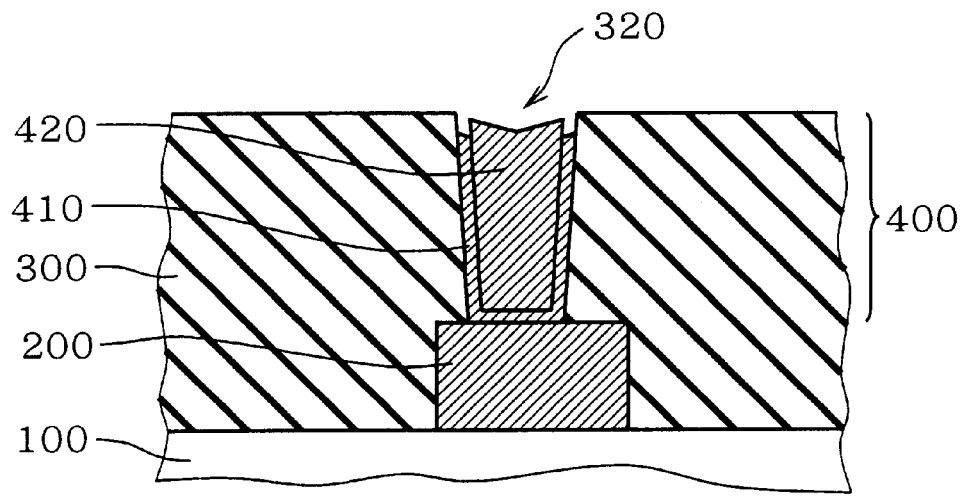

Referring to FIG. 5, with a dry etching using an F based gas, e.g. a mixed gas of Ar and $SF_6$, the surface of the tungsten layer 420 is removed until the barrier metal layer 410 is exposed. Then, with a dry etching using a $Cl_2$ based gas, e.g., a mixed gas of $N_2$ and $Cl_2$, the surface of the barrier metal layer 410 is removed until the interlayer insulation film 300 is exposed. As a result, the barrier metal layer 410 and a plug-shaped tungsten layer 420 remain only in the wire burying hole 320. The metal in the wire burying hole 320 is defined as a conductor 400. This is true for other preferred embodiments.

Figure 6:
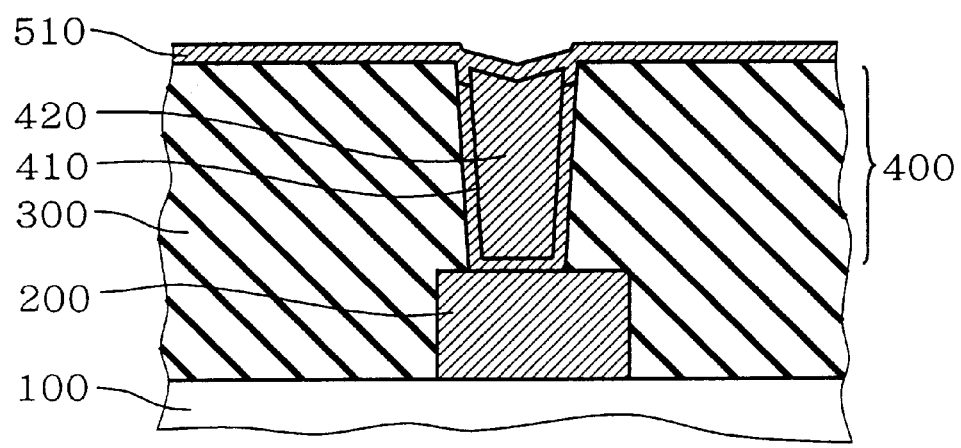

Referring to FIG. 6, a barrier metal layer 510 comprising a Ti layer in the lower part and a TiN layer in the upper part is formed on the structure shown in FIG. 5. Here, the film thicknesses of the Ti layer and the TiN layer are 20 nm and 70 nm, respectively. The barrier metal layer 510 becomes an erosion inhibitor.

Figure 7:
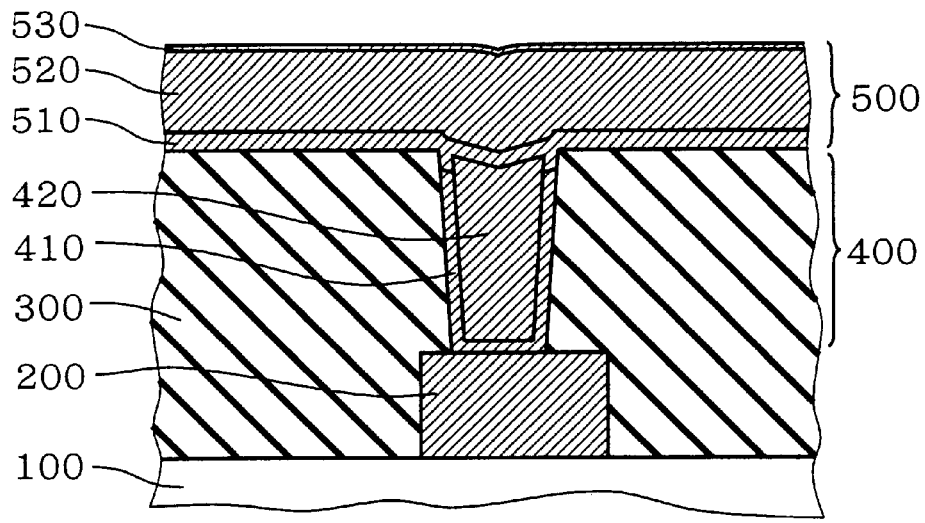

Referring to FIG. 7, an aluminum wire layer 520 is formed by sputtering on the structure shown in FIG. 6, so that it has a thickness of 400 nm, for example. Then, an antireflection layer 530 that is TiN is formed on the aluminum wire layer 520 so that it has a thickness of 30 nm, for example. The metal layer formed on the interlayer insulation film 300 is defined as a wire layer 500. This is true for other preferred embodiments.

Figure 8:
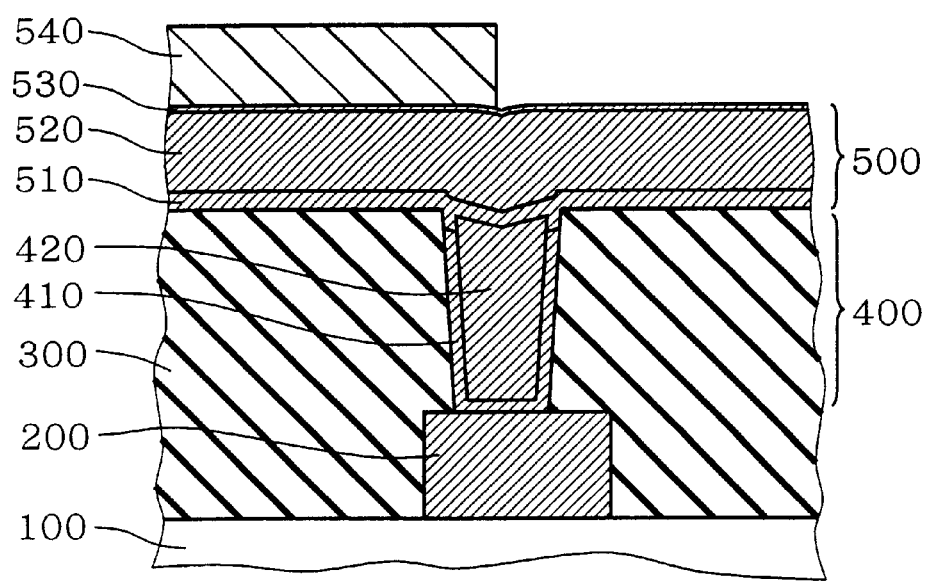

Referring to FIG. 8, a resist 540 is formed on the structure shown in FIG. 7, by using a known technique, and a patterning is conducted so that the end of the resist 540 is located above the conductor 400.

Figure 9:
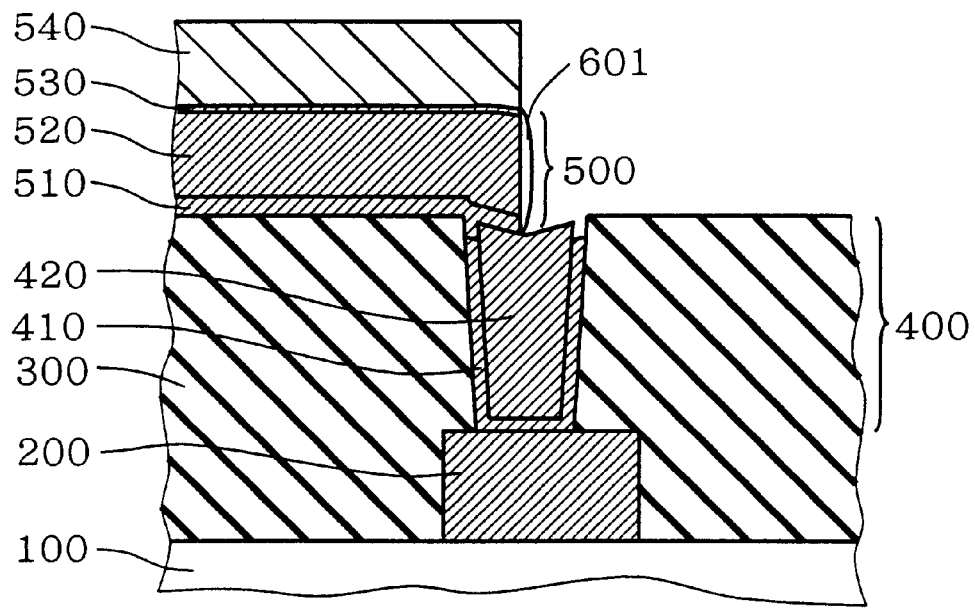
FIG. 9 is a cross-sectional view of a contact structure of the first preferred embodiment.

Referring to FIG. 9, by using a mixed gas of $Cl_2$, $BCl_3$, Ar and $CHF_3$ (for instance, in the amount of 70 sccm, 50 sccm, 40 sccm and 3 sccm, respectively), the wire layer 500 is subjected to a patterning by a dry etching under conditions, that is, 1.3 Pa etching pressure, 800 W source power, and 140 W bias power, for example. During the dry etching, a product, e.g., $AlCl_x$, which is generated by the etching of the aluminum wire layer 520, deposits on the side walls of the wire layer 500. This results in a side wall protection film 601 on the side walls of the wire layer 500.

The fact that the contact area between the aluminum wire layer 520 and the barrier metal layer 510 is resistant to erosion has been verified by the following experiment. Specifically, there were prepared a sample in which a barrier metal layer and an aluminum containing layer are successively formed on the entire surface of a wafer, and a sample in which a tungsten layer and an aluminum containing layer are successively formed on the entire surface of a wafer. For the two samples, an etching is conducted under the same conditions, to observe them on a SEM monitor. As a result, erosion occurred in the contact area between the tungsten layer and the aluminum containing layer, whereas little or no erosion occurred in the contact area between the barrier metal layer and the aluminum containing layer. This may result from that compared to the former area, the latter area is susceptible to the formation of a side wall protection film.

Thus, in the first preferred embodiment, thanks to non-contact between the tungsten layer 420 and the aluminum wire layer 520, the erosion of the aluminum layer 520 is suppressed, thereby preventing disconnection between the conductor 400 and the wire layer 500.

Second Preferred Embodiment

Figure 10:
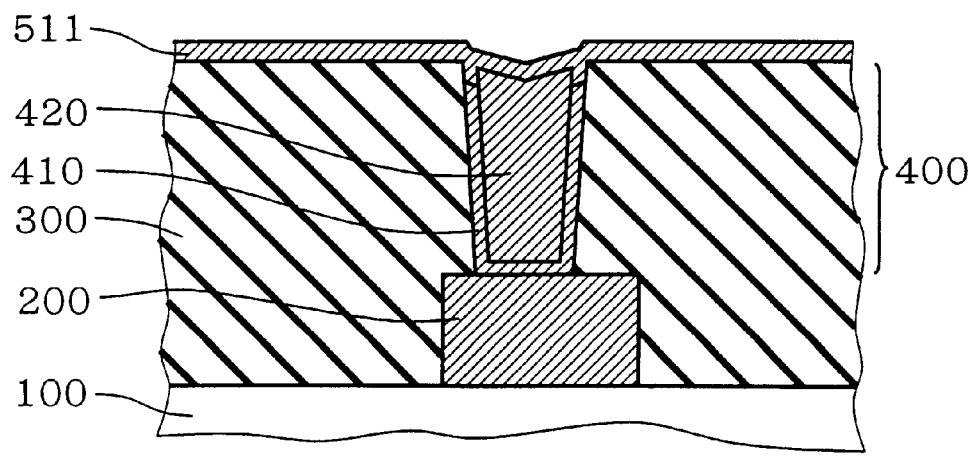
FIG. 10 is a cross-sectional view showing a step in a method for manufacturing a contact structure according to a second preferred embodiment of the present invention.

Referring to FIG. 10, the structure shown in FIG. 5 is obtained in the same manner as in the first preferred embodiment. Then, a tungsten layer 511 is formed on that structure.

Figure 11:
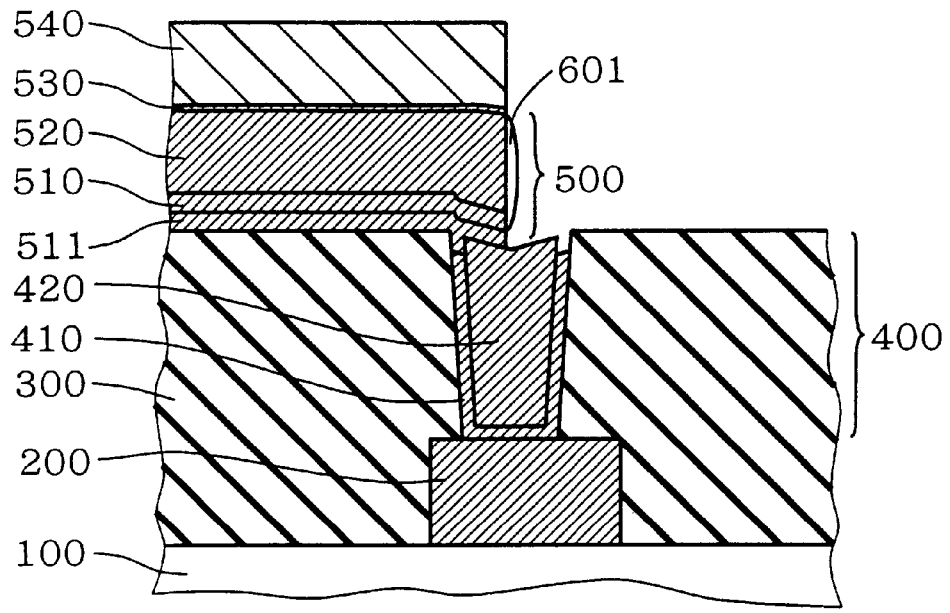
FIG. 11 is a cross-sectional view of a contact structure of the second preferred embodiment.

Referring to FIG. 11, a barrier metal layer 510, an aluminum wire layer 520, an antireflection layer 530 and a resist 540 are formed and the wire layer 500 is subjected to a patterning by a dry etching, in the same manner as in the first preferred embodiment. During the dry etching, a product e.g., $AlCl_x$, which is generated by the etching of the aluminum wire layer 520, deposits on the side walls of the wire layer 500. This results in a side wall protection film 601 on the side walls of the wire layer 500. The tungsten layer 511 and the barrier metal layer 510 become erosion inhibitors.

The second preferred embodiment produces the same effects as the first preferred embodiment.

Third Preferred Embodiment

Figure 12:
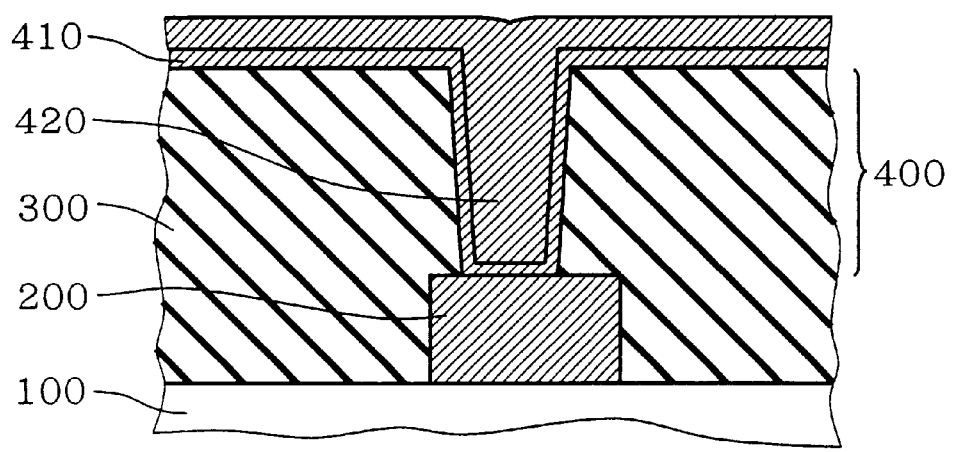
FIGS. 12 to 14 are cross-sectional views showing a sequence of steps in a method for manufacturing a contact structure according to a third preferred embodiment of the present invention.

Referring to FIG. 12, the structure shown in FIG. 4 is obtained in the same manner as in the first preferred embodiment. Then, by a dry etching using an F based gas, e.g. a mixed gas of Ar and $SF_6$, the surface of the tungsten layer 420 is removed so that the film thickness of the tungsten layer 420 is about half (e.g., about 200 nm) that of a wire layer 500 finally formed.

Figure 13:
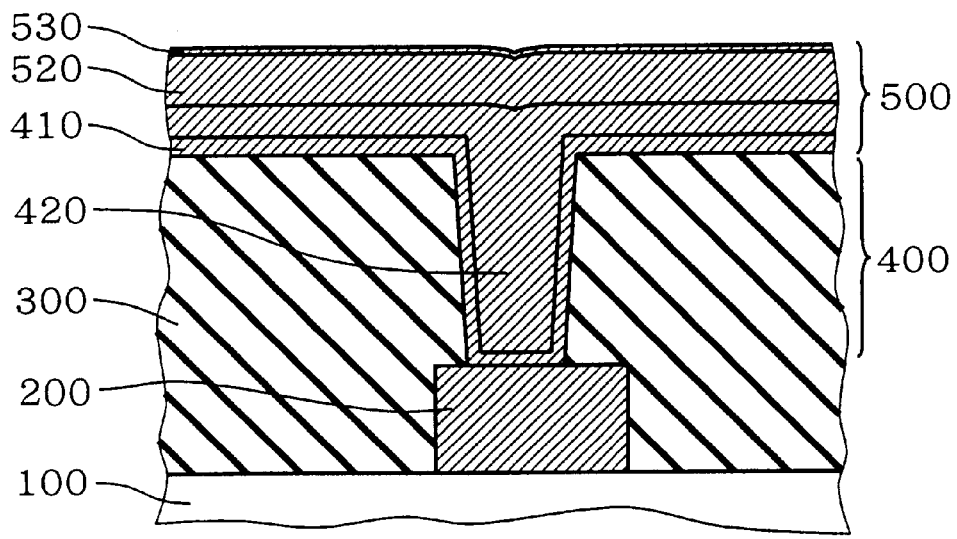

Referring to FIG. 13, an aluminum wire layer 520 is formed by sputtering on the structure shown in FIG. 12, so that its film thickness is about half (e.g., about 200 nm) that of the wire layer 500. Then, an antireflection layer 530 that is TiN is formed on the aluminum wire layer 520, so that it has a thickness of 30 nm, for example.

Figure 14:
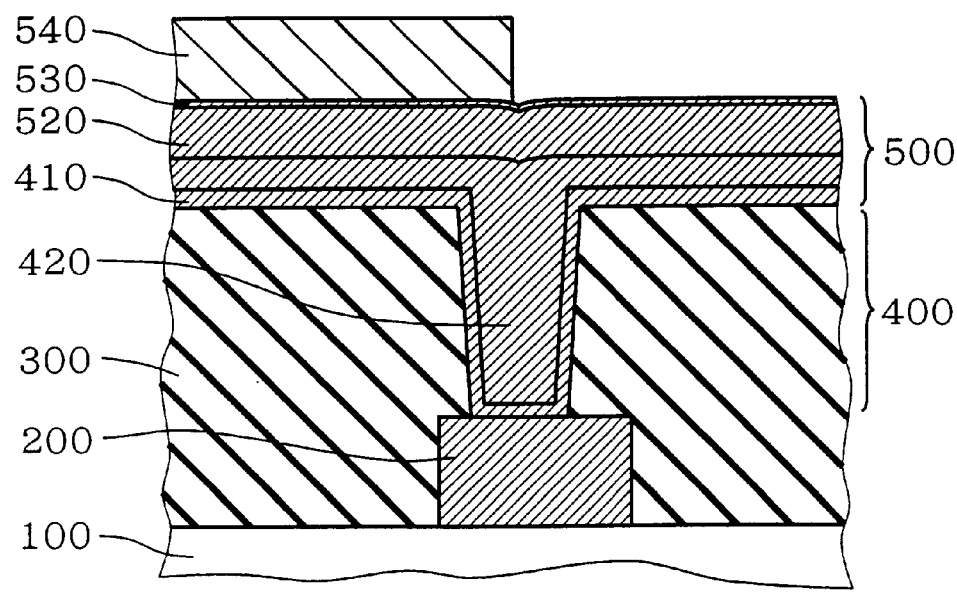

Referring to FIG. 14, a resist 540 is formed on the structure shown in FIG. 13, and a puttering is conducted.

Figure 15:
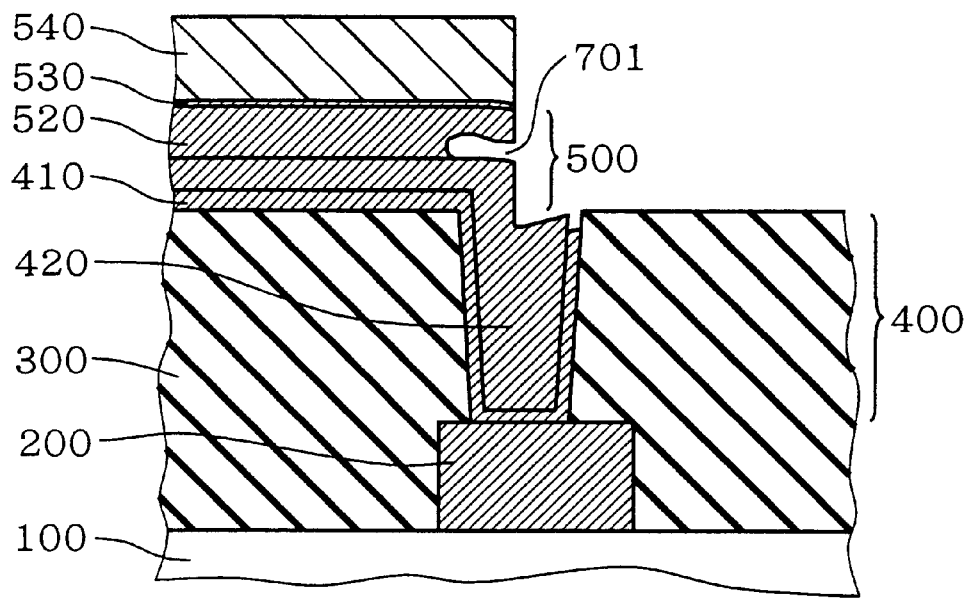
FIG. 15 is a cross-sectional view of a contact structure of the third preferred embodiment.

Referring to FIG. 15, by using a mixed gas of $Cl_2$, $BCl_3$, Ar and $CHF_3$ (for instance, in the amount of 70 sccm, 50 sccm, 40 sccm and 3 sccm, respectively), the antireflection layer 530 and the aluminum wire layer 520 are subjected to a patterning by a dry etching under conditions, that is, 1.3 Pa etching pressure, 800 W source power, and 140 W bias power, for example. Then, the tungsten layer 420 and the barrier metal layer 410 are subjected to a patterning by a dry etching using a mixed gas of $BCl_3$, $Cl_2$, and $SF_6$. The tungsten layer 420 in the wire layer 500 becomes an erosion inhibitor.

Thus, in the third preferred embodiment, the side walls of the wire layer 500 are resistant to the formation of the side wall protection film 601 because the aluminum wire layer 520 is in contact with the tungsten layer 420. Part of the aluminum wire layer 520 being in contact with the tungsten layer 420 is eroded to cause a clearance 701. However, this erosion extends only to the aluminum wire layer 520 in the direction of the interface between the aluminum wire layer 520 and the tungsten layer 420, and the tungsten layer is not eroded. This produces the conductive state between the conductor 400 and the wire layer 500, through the tungsten layer 420, thus preventing disconnection therebetween.

As described in the first to third preferred embodiments, the metal formed between the aluminum wire layer 520 and the conductor 400 should be a metal other than aluminum. In the third preferred embodiment, the tungsten layer 420 may be deposited for burying the tungsten in the wire burying hole 320, to form the metal between the aluminum wire layer 520 and the conductor 400.

Fourth Preferred Embodiment

Figure 16:
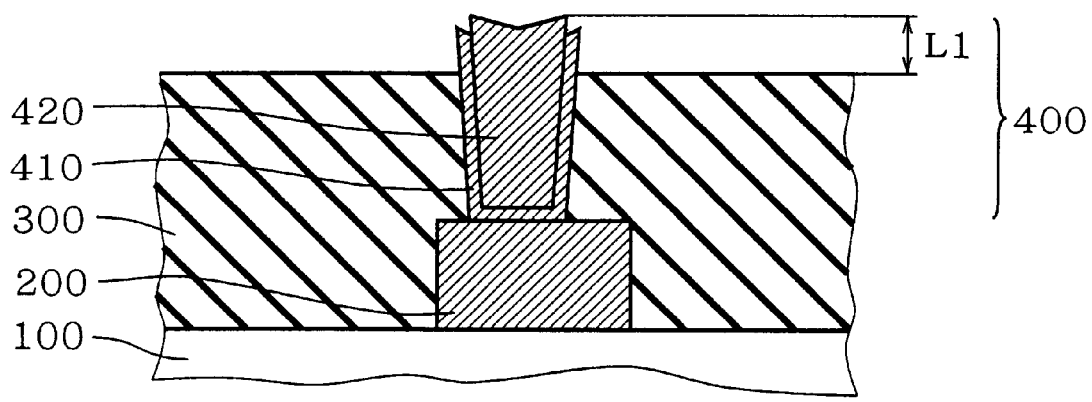
FIGS. 16 to 21 are cross-sectional views showing a sequence of steps in a method for manufacturing a contact structure according to a fourth preferred embodiment of the present invention.

Referring to FIG. 16, the structure shown in FIG. 5 is obtained in the same manner as in the first preferred embodiment. Then, by a wet etching using hydrofluoric acid or a dry etching using an F based gas, e.g. a mixed gas of $CHF_3$, $CF_4$ and Ar, the surface of the interlayer insulation film 300 is removed. With this etch back, the top surface of the conductor 400 is located above the top surface of the interlayer insulation film 300. Distance L1 between the top surface of the conductor 400 and that of the film 300 may be varied by changing etching time.

Figure 17:
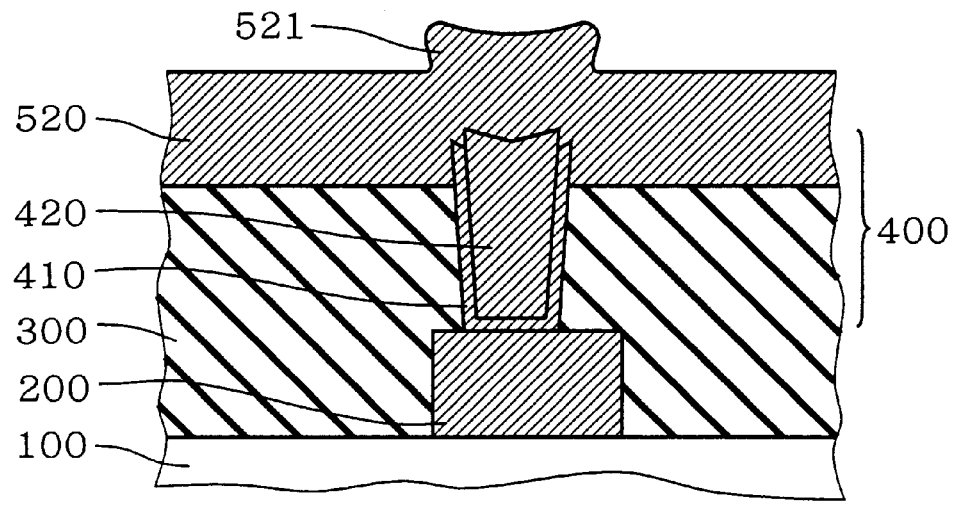

Referring to FIG. 17, an aluminum wire layer 520 is formed on the structure shown in FIG. 16 by sputtering so that its film thickness is 50 nm. When the aluminum wire layer 520 is formed by sputtering, a projection 521 projecting from the primary surface of the aluminum wire layer 520 is produced depending on distance L1.

Figure 18:
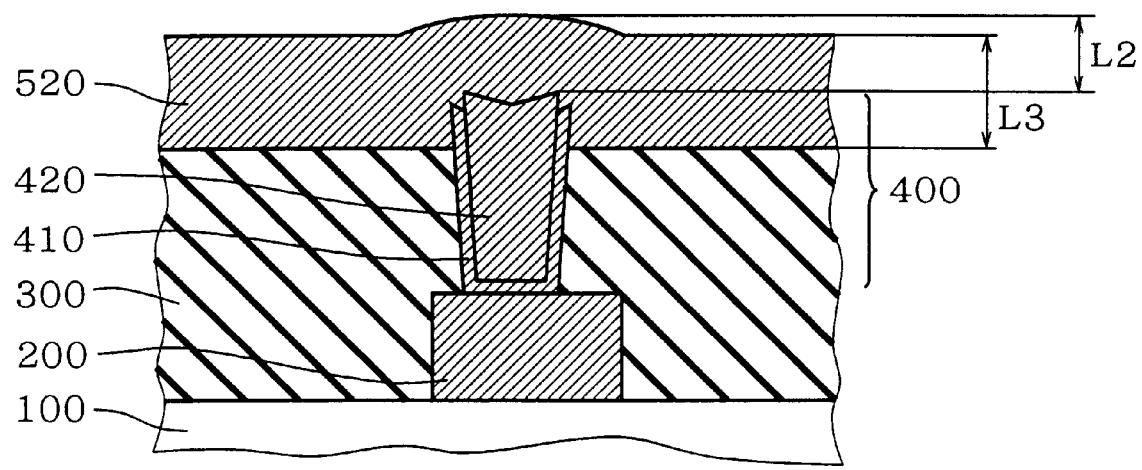

Referring to FIG. 18, the structure shown in FIG. 17 is subjected to a heat treatment to smooth the rejection of the top surface of the aluminum wire layer 520.

By use of sputtering at high temperature (i.e., hot sputtering) in forming an aluminum wire layer 520, the production of the projection 521 shown in FIG. 18 is avoided without the hot treatment. Here, the temperature of a wafer stage (not shown) is set to not less than 450° C., for example.

Figure 19:
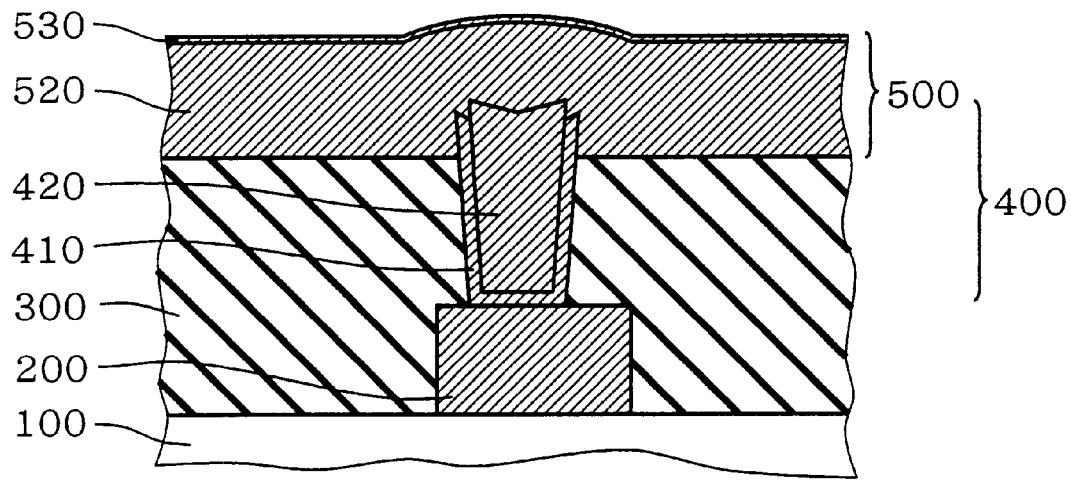

Referring to FIG. 19, an antireflection layer 530 is formed on the structure shown in FIG. 18, in the same manner as in the first preferred embodiment.

Figure 20:
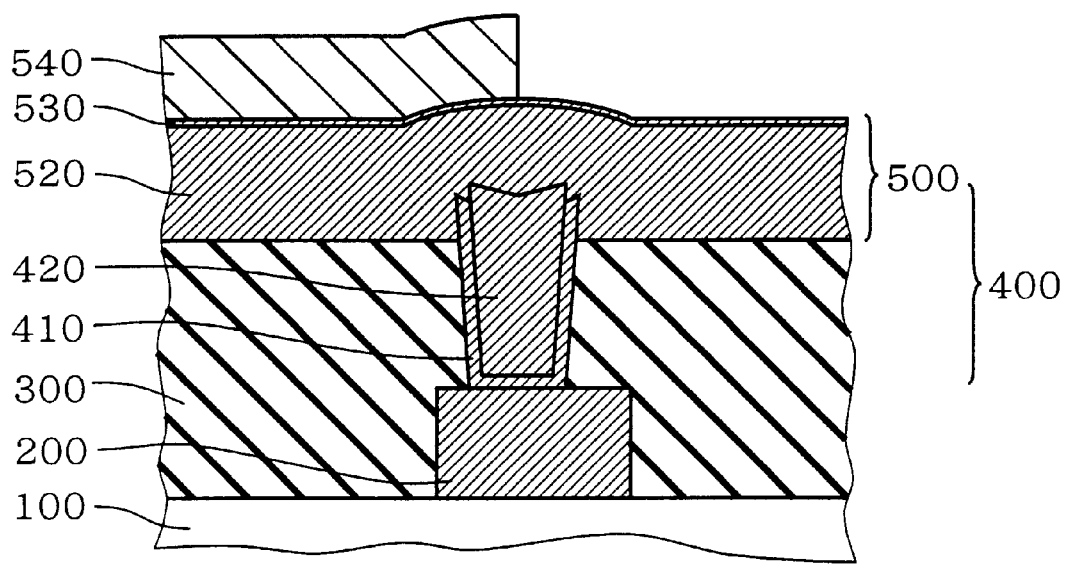

Referring to FIG. 20, a resist 540 is formed on the structure shown in FIG. 19, and a patterning is then conducted, in the same manner as in the first preferred embodiment.

Figure 21:
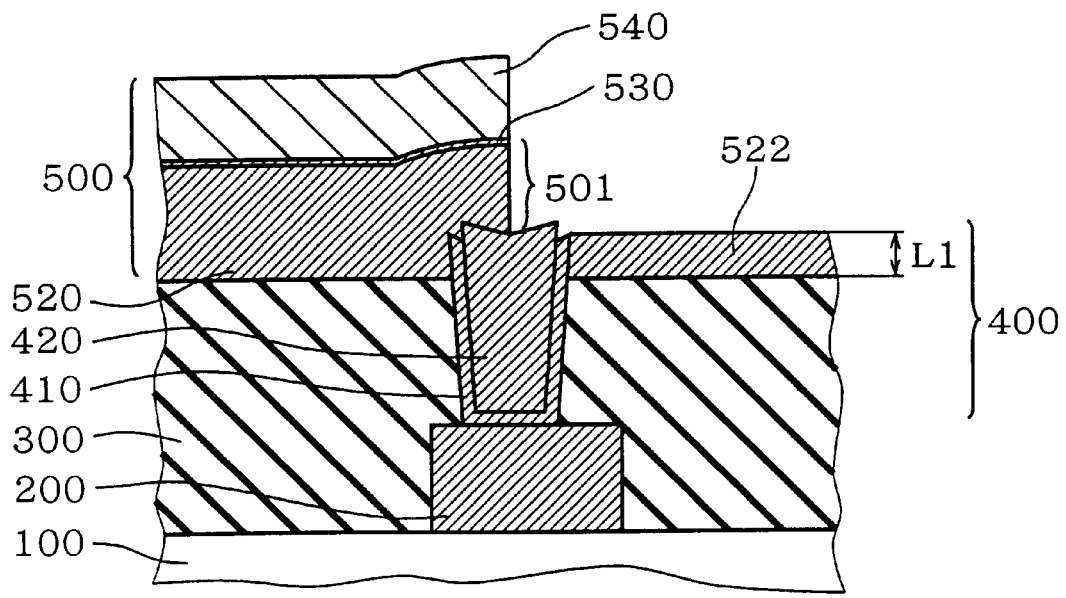
Figure 22:
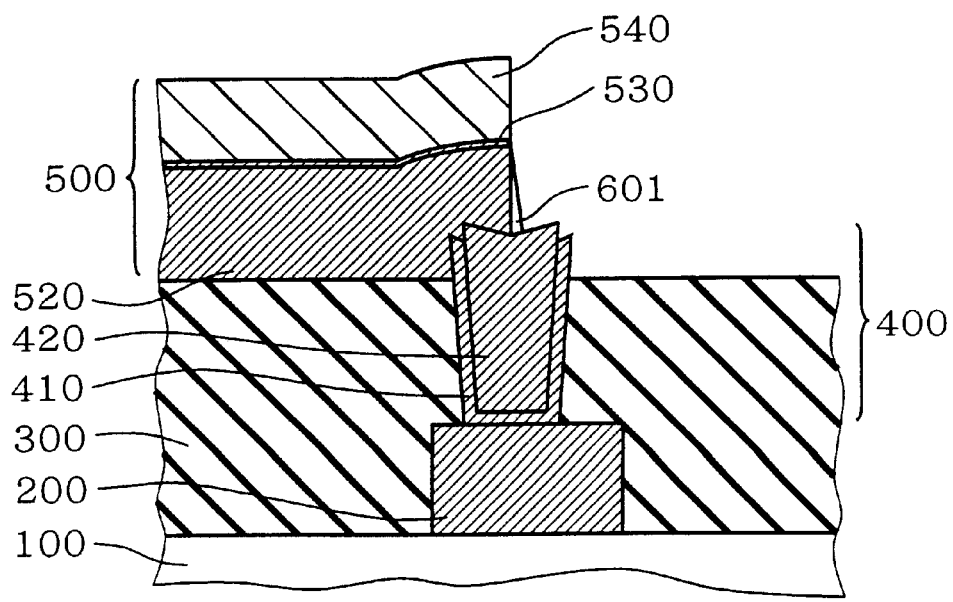
FIG. 22 is a cross-sectional view of a contact structure of the fourth preferred embodiment.

Referring to FIGS. 21 and 22, a wire layer 500 is subjected to a patterning by a dry etching using a gas plasma of $Cl_2$ and $BCl_3$. FIG. 21 shows a state in the course of the dry etching, that is, the point that the top surface of a conductor 400 is exposed. At this time, part of the aluminum wire layer 520 remains on the top surface of the interlayer insulation film 300, as a product supply source 522 having dimension L1. As the etching is progressed, a product, e.g., $AlCl_x$, which is generated by the etching of the product supply source 522, deposits on the side walls of the wire layer 500. This results in a side wall protection film 601 on the side walls of the wire layer 500, as shown in FIG. 22. Here, part of the conductor 400 projecting from the surface of the interlayer insulation film 300, becomes an erosion inhibitor.

Referring again to FIG. 18, L2 designates a distance from the top surface of the conductor 400 to that of the aluminum wire layer 520; and L3 designates a distance from the top surface of the interlayer insulation film 300 to the top surface of the aluminum wire layer 520. Taking the side wall protection film 601 into consideration, it is desirable that L3 is satisfactorily longer than L2, i.e., about two times of L2. When L1 is 250 nm and the above heat treatment was conducted at 400° C. for two minutes, L3 was about 450 nm and L2 was about 200 nm. By making L3 sufficiently longer than L2, it is possible to form the side wall protection film 601 which covers the entire side walls of the wire layer 500 in a sufficient thickness.

Thus, in the fourth preferred embodiment the formation of the product supply source 522 permits a side wall protection film 601 covering the entire side walls of the wire layer 500 in a sufficient thickness. Therefore, the side walls of the wire layer 500 are free from erosion, thus preventing disconnection between the conductor 400 and the wire layer 500.

Figure 23:
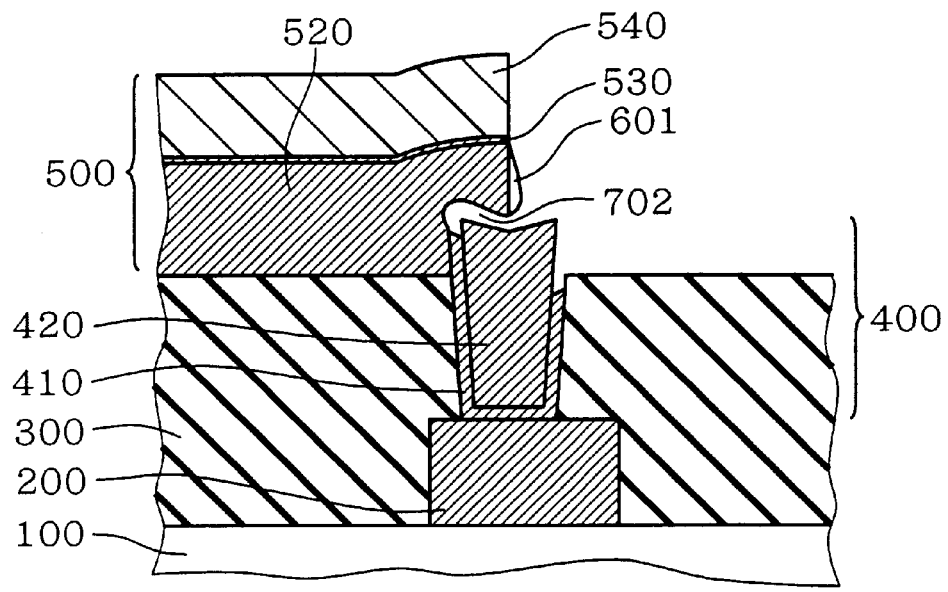
FIG. 23 is a cross-sectional view of a contact structure of a fifth preferred embodiment of the present invention.

Referring to FIG. 23, as L3 is shorter than double length of L2, the side wall protection film 601 becomes thinner in part of the side walls of the wire layer 500, or no film 601 may be formed. When no side wall protection film 601 is formed in portions close to the interface between the wire layer 500 and the conductor 400, part of the aluminum wire layer 520 being in contact with the tungsten layer 420 is eroded to case a clearance 702. However, the contact area between the aluminum wire layer 520 and the barrier metal layer 410 is resistant to erosion, as stated in the first preferred embodiment. Therefore, even if a clearance 702 occurs, the contact between the layers 520 and 410 ensures the electrical conductibility between the wire layer 500 and the conductor 400. In addition, it is possible to reduce the resistance of the contact area between the aluminum wire layer 520 and the barrier metal layer 410, if the contact area therebetween is increased by adjusting the etch back, as stated with respect to FIG. 16.

Fifth Preferred Embodiment

Figure 24:
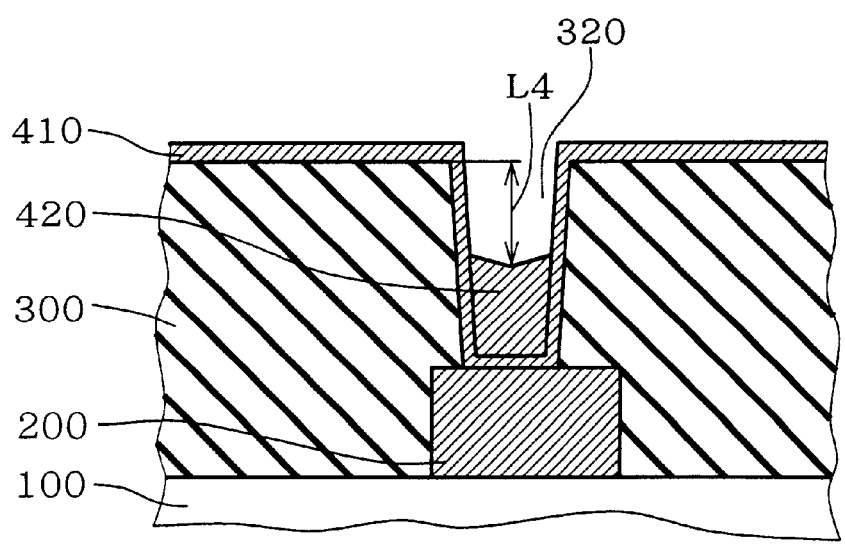
FIGS. 24 to 28 are cross-sectional views showing a sequence of steps in a method for manufacturing a contact structure according to the fifth preferred embodiment.

Referring to FIG. 24, the structure shown in FIG. 4 is obtained in the same manner as in the first preferred embodiment. Then, with a dry etching using an F based gas, e.g. a mixed gas of Ar and $SF_6$, the surface of a tungsten layer 420 is removed to expose the barrier metal layer 410, so that the tungsten layer 420 remains in a wire burying hole 320. In FIG. 24, L4 designates a distance (i.e., concave portion amount) from the top surface of the tungsten layer 420 left in the wire burying hole 320 to the top surface of the interlayer insulation film 300.

Figure 25:
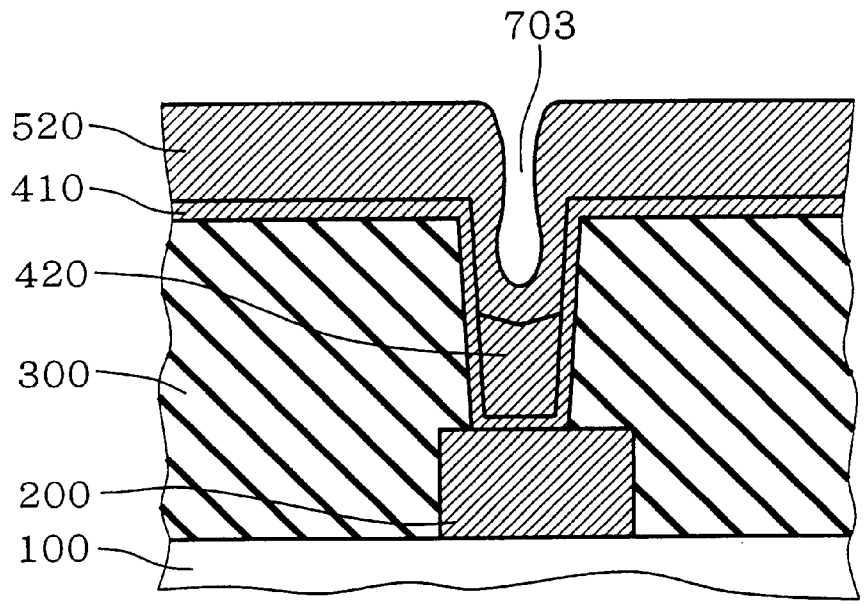

Referring to FIG. 25, an aluminum wire layer 520 is formed by sputtering on the structure shown in FIG. 24, so that it has a thickness of 400 nm, for example.

Figure 26:
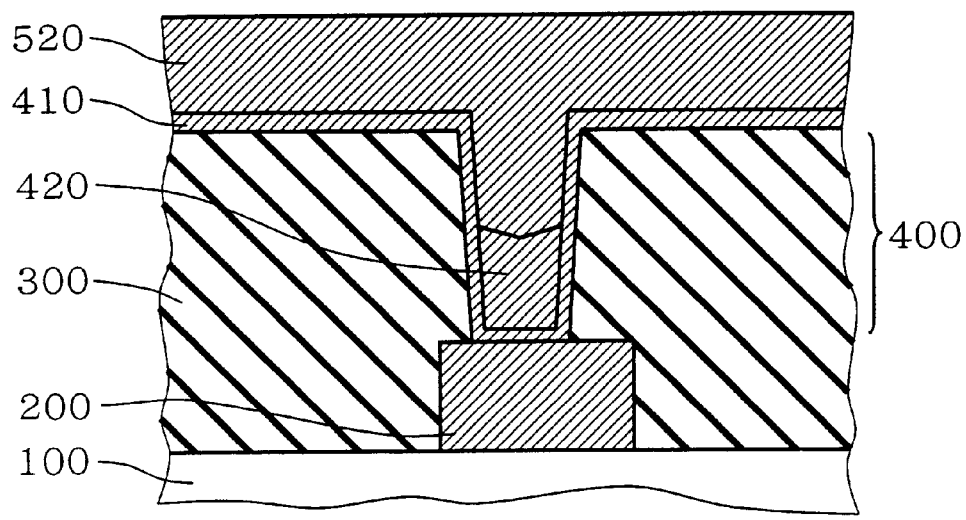

Referring to FIG. 26, the formation of the aluminum wire layer 520 by sputtering produces a clearance 703 in the aluminum wire layer 520, depending on L4. Hence, the structure shown in FIG. 25 is subjected to a heat treatment for vanishing the clearance 703 to flatten the aluminum wire layer 520. Here, the aluminum wire layer 520 filled in the wire burying hole 320 becomes an erosion inhibitor.

If a hot sputtering is employed in forming an aluminum wire layer 520, the structure shown in FIG. 26 can be obtained without the above hot treatment. The temperature of the heat treatment and the temperature of a wafer stage (not shown) during the heat treatment are set to not less than 450° C., for example.

Figure 27:
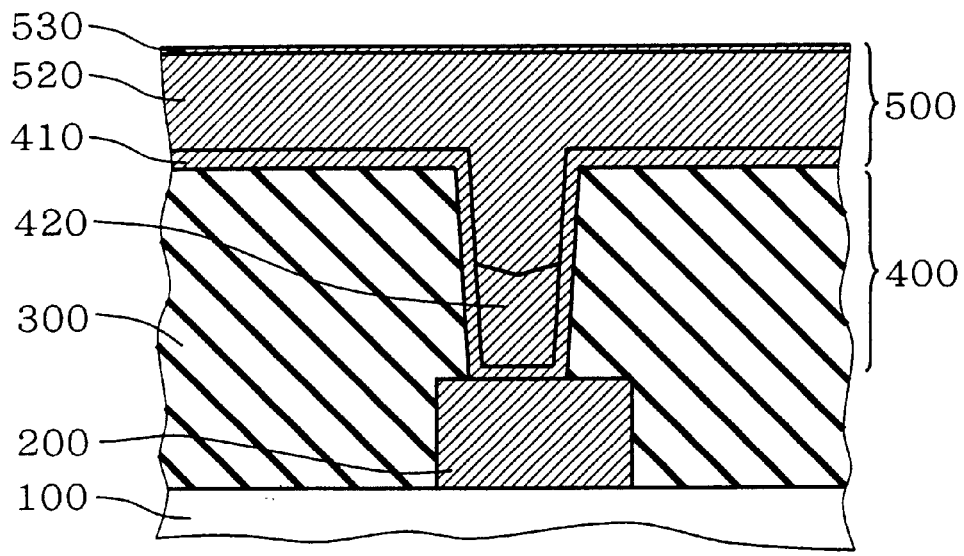

Referring to FIG. 27, an antireflection layer 530 that is TiN is formed on the aluminum wire layer 520 so as to have a thickness of 30 nm, for example.

Figure 28:
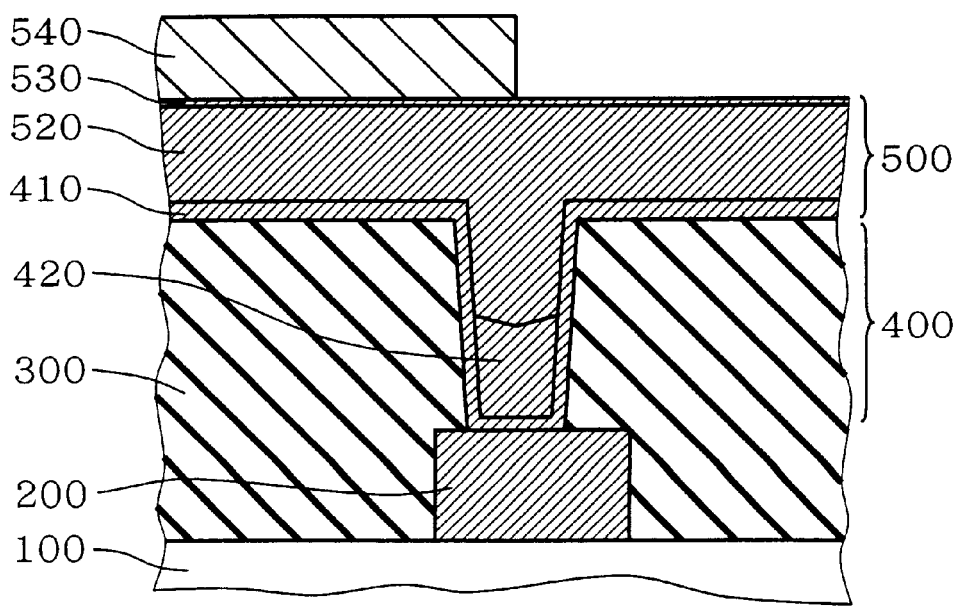

Referring to FIG. 28, a resist 540 is formed on the structure shown in FIG. 27, by using a known technique, and a patterning is conducted.

Figure 29:
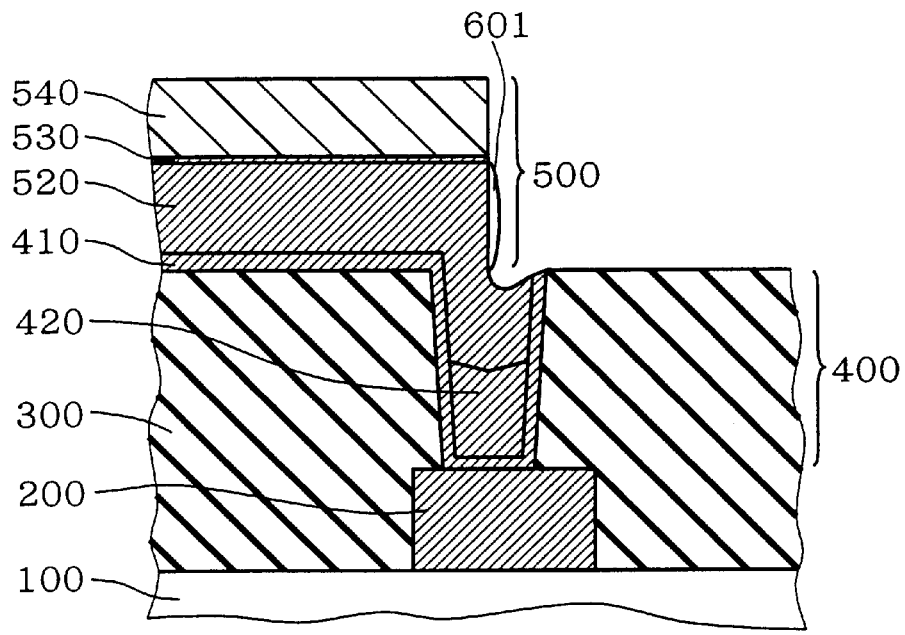
FIGS. 29 and 30 are cross-sectional views of a contact structure of the fifth preferred embodiment.

Referring to FIG. 29, a wire layer 500 is subjected to a patterning by a dry etching using a mixed gas plasma of $Cl_2$ and $BCl_3$. A product, e.g., $AlCl_x$, which is generated by the etching of the aluminum wire layer 520, deposits on the side walls of the wire layer 500. This results in a side wall protection film 601 on the side walls of the wire layer 500.

Figure 30:
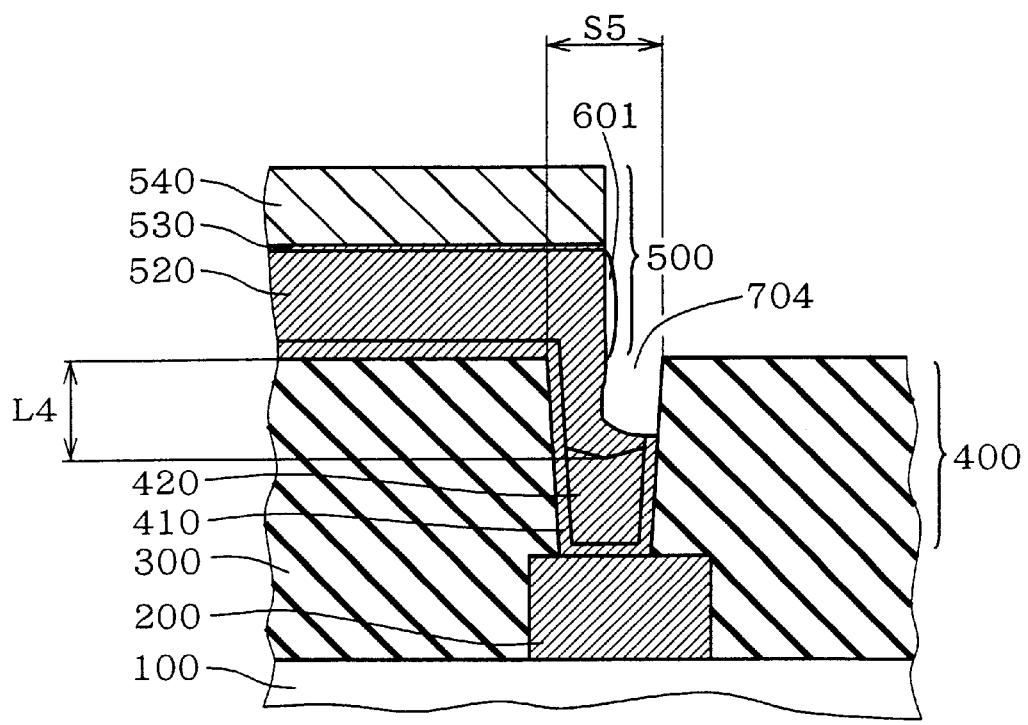

Referring to FIG. 30, a further etching to the structure shown in FIG. 29, may cause a clearance 704. As the etching is progressed, the aspect ratio of the clearance 704 is increased. Generally, at higher aspect ratios, the etching rate in the clearance 704 is lowered than other portions. As the aspect ratio is increased, the erosion ratio in the clearance 704 is decreased. Accordingly, the contact area between the tungsten layer 420 and the aluminum wire layer 520 is resistant to exposure and thus becomes resistant to erosion, causing no separation therebetween.

The erosion in the clearance 704 can also be suppressed by supplying the clearance 704 with a carbon based deposit that is eliminated from the resist 540 due to the etching.

Delay of the etching rate in the clearance 704 is referred to as RIE-Lag. The erosion in the clearance 704 is suppressed by setting etching conditions under which RIE-Lag has a high value (e.g., at low gas flow rate, low pressure, and high power).

Although the corner of the interlayer insulation film 300 in the wire burying hole 320 is generally rounded by using etching by sputtering, such a step is omitted here, and therefore, the aspect ratio of the clearance 704 is not lowered, thus suppressing the erosion in the clearance 704.

As described, the increase in aspect ratio with the progress of etching, the supply of the carbon based deposit, the etching conditions for obtaining a high RIE-Lag, and the omission of the step for rounding the inter layer insulation film 300, produce the effect that even if a local excessive etching is conducted for the structure shown in FIG. 28, the clearance 704 is suppressed from being eroded, causing no exposure of the tungsten layer 420. Thus, if erosion occurs in the contact area between the tungsten layer 420 and the aluminum wire layer 520, a separation therebetween is practically non-existent. With respect to FIG. 30, it is sufficient if L4 is not less than 200 nm.

Thus, the fifth preferred embodiment produces the following effects. The side wall protection film 601 prevents the side walls of the wire layer 500 from being eroded. Even when a clearance 704 occurs in the aluminum wire layer 520 within the wire burying hole 320, the erosion of the aluminum wire layer 520 in the clearance 704 can be suppressed by an increase in the aspect ratio, and the like. This prevents disconnection between the conductor 400 and the tungsten layer 420. In addition, there is no increase in the electrical resistance between the aluminum wire layer 520 and the tungsten layer 420, because the contact area therebetween is approximately equal to area S5 of the wire burying hole 320.

Sixth Preferred Embodiment

Figure 31:
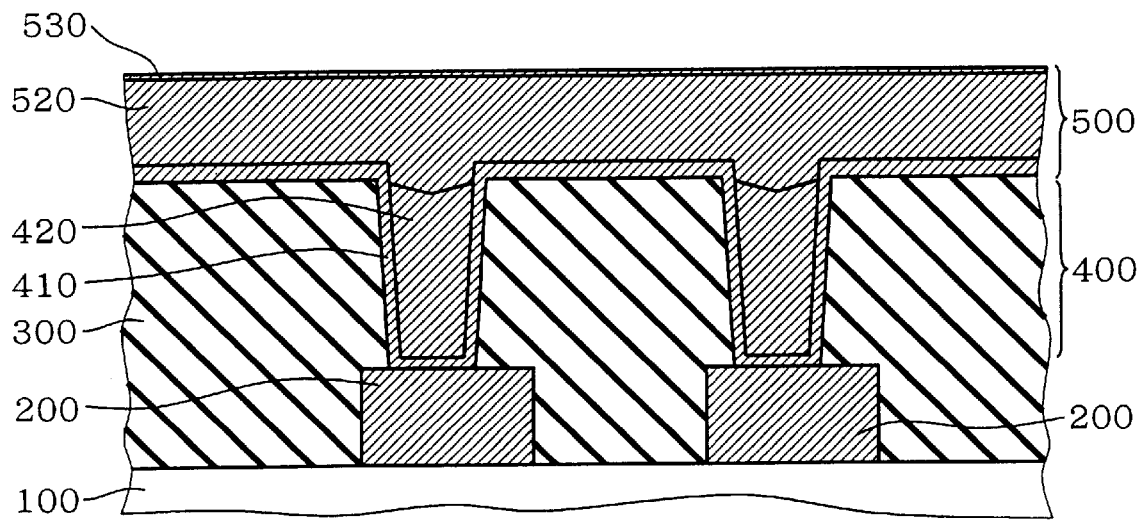
FIGS. 31 to 34 are cross-sectional views showing a sequence of steps in a method for manufacturing a contact structure according to a sixth preferred embodiment of the present invention.

Referring to FIG. 31, a structure similar to that shown in FIG. 27 with respect to the fifth preferred embodiment is obtained. There are two conductors 400, and the recess amount is zero.

Figure 32:
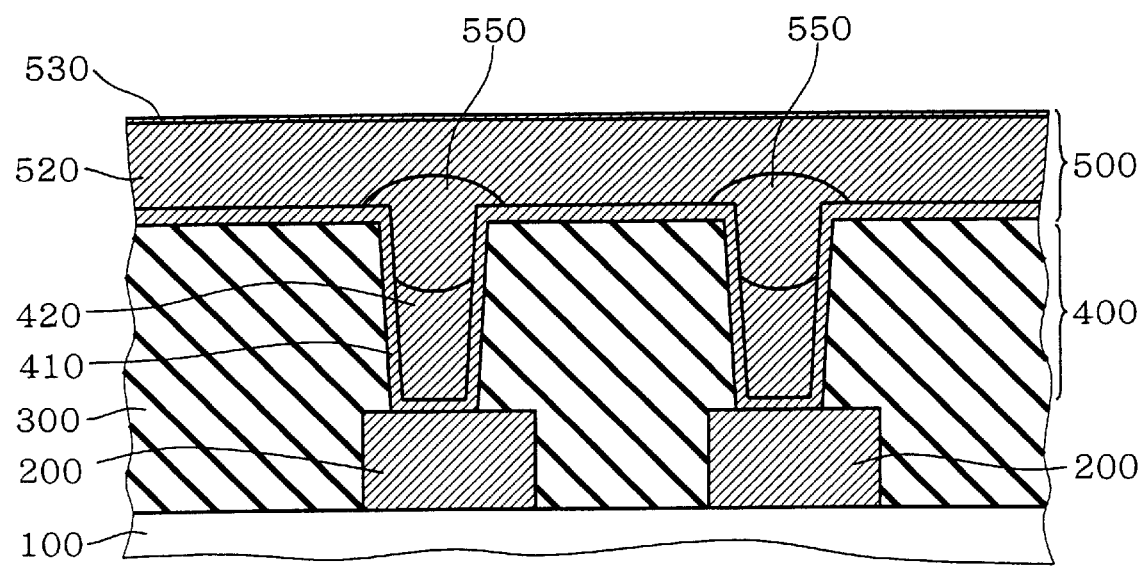

Referring to FIG. 32, the structure shown in FIG. 31 is subjected to a heat treatment at 400° C. for 30 minutes in an atmosphere of $N_2$. As a result, a diffusion region 550 in which aluminum and tungsten are mutually diffused in self alignment manner, is formed in the interface between a tungsten layer 420 and an aluminum wire layer 520. Here, the diffusion region 550 becomes an erosion inhibitor.

Figure 33:
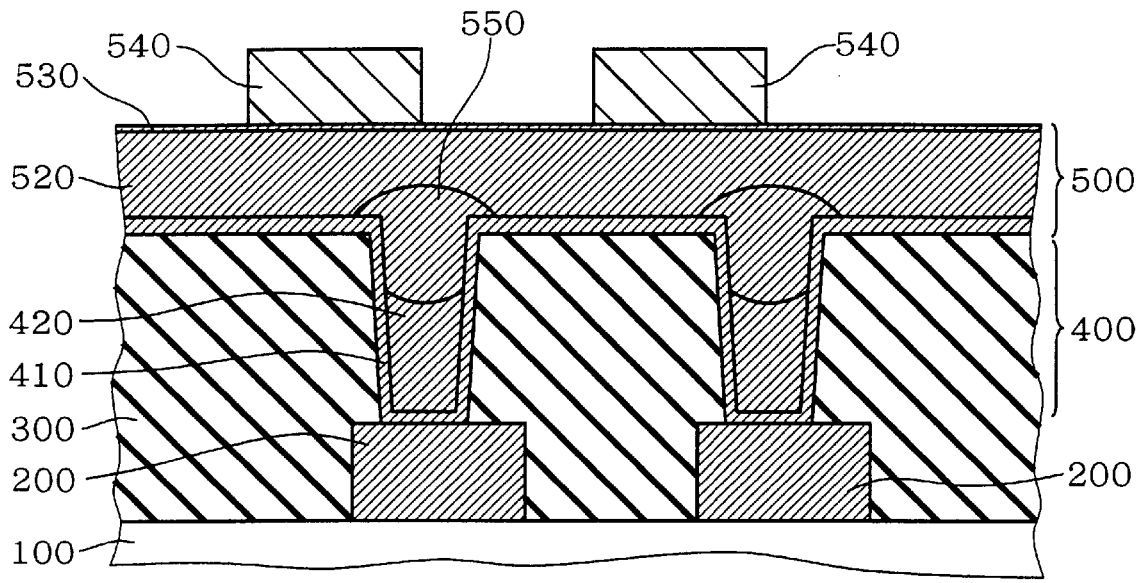

Referring to FIG. 33, a resist 540 is formed on the structure shown in FIG. 32, by using a known technique, and a patterning is then conducted.

Figure 34:
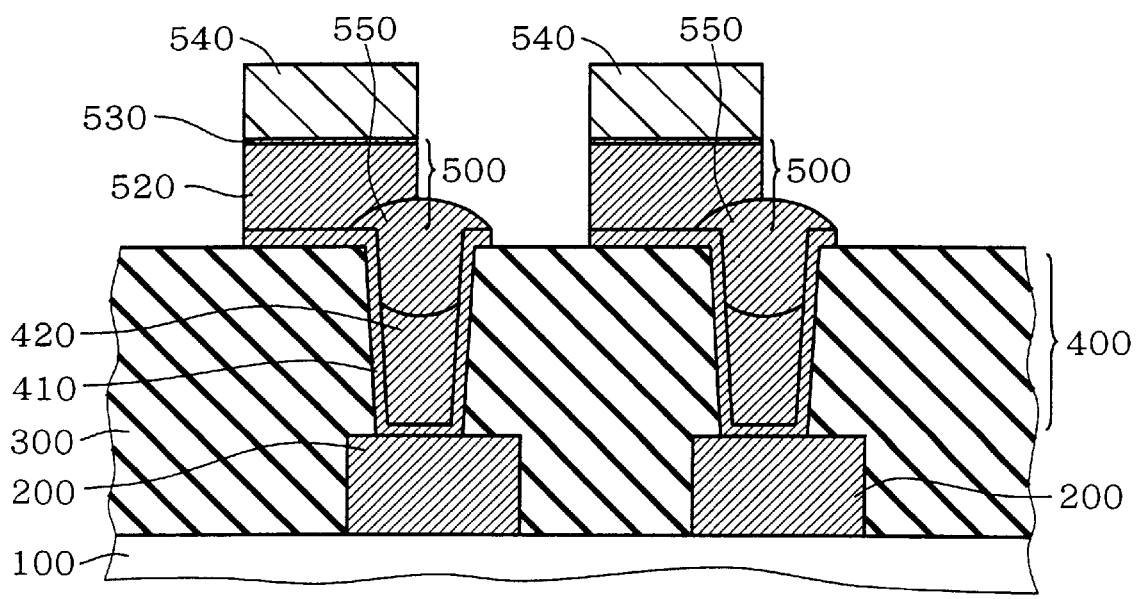

Referring to FIG. 34, the wire layer 500 is subjected to a patterning by a dry etching using a chlorine based gas, e.g., a mixed gas of $Cl_2$ and $BCl_3$. In this dry etching, the etching rate is low, and therefore, part of the diffusion region 550 remains between two wire layers 500.

Figure 35:
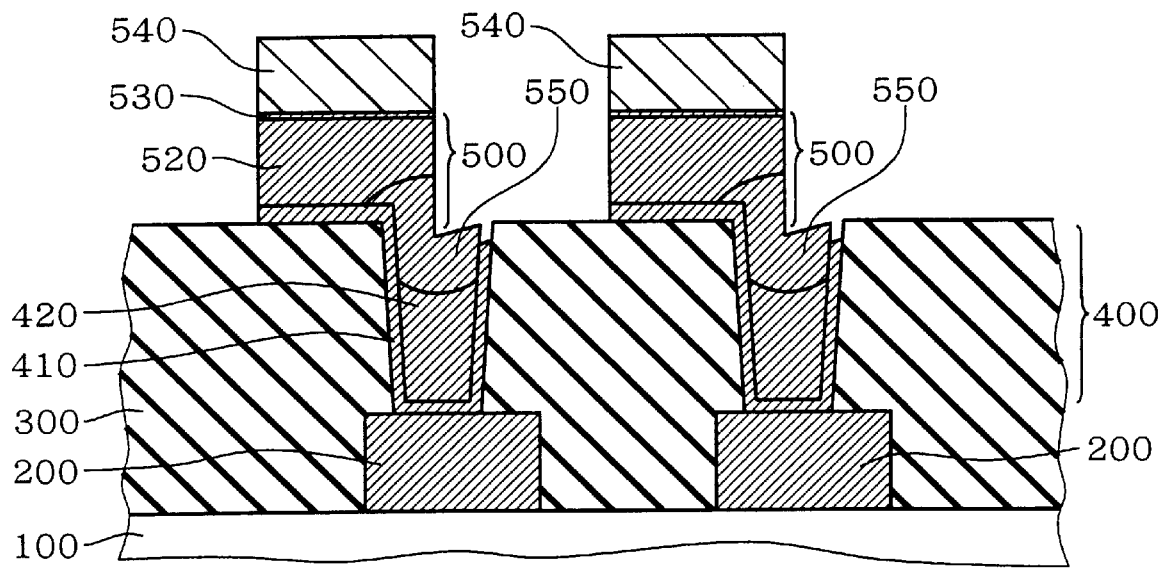
FIG. 35 is a cross-sectional view of a contact structure of the sixth preferred embodiment.

Referring to FIG. 35, the remaining diffusion region 550 may increase the possibility that the two wire layers 500 are electrically connected with each other through the diffusion region 550. It is possible to remove the remaining diffusion region 550 between the two wire layers 500 by prolonged dry etching using a chlorine based gas, e.g., a mixed gas of $Cl_2$ and $BCl_3$. However, the film thickness of the resist 540 reduces and the dimension accuracy deteriorates. Hence, part of the diffusion region 550 is removed by a dry etching using a fluorine based gas, e.g., $CHF_3$, $CF_4SF_6$, $C_4F_8$, $CH_2F_2$, $C_3F_6$ or $NF_3$, and a mixed gas of $Cl_2$ and $BCl_3$.

Thus, in the sixth preferred embodiment, the diffusion region 550 interposes between the tungsten layer 420 and the aluminum wire layer 520. Compared to the case where the tungsten layer 420 is in contact with the aluminum wire layer 520, the portions where the diffusion region 550 is in contact with the aluminum wire layer 520 are more resistant to erosion, thereby preventing disconnection between the conductor 400 and the wire layer 500.

Seventh Preferred Embodiment

Figure 54:
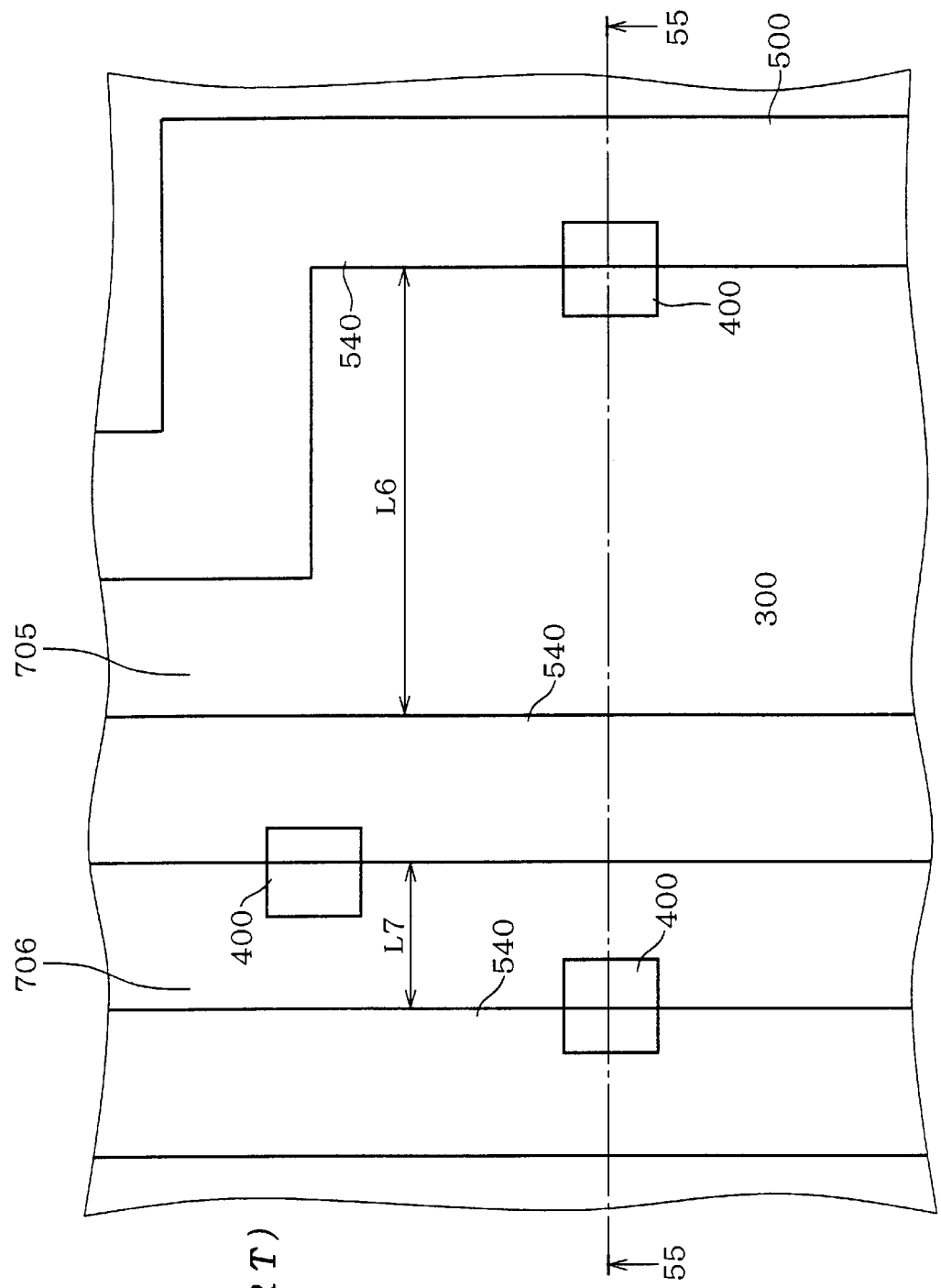
FIG. 54 is a plan view of a conventional contact structure.
Figure 55:
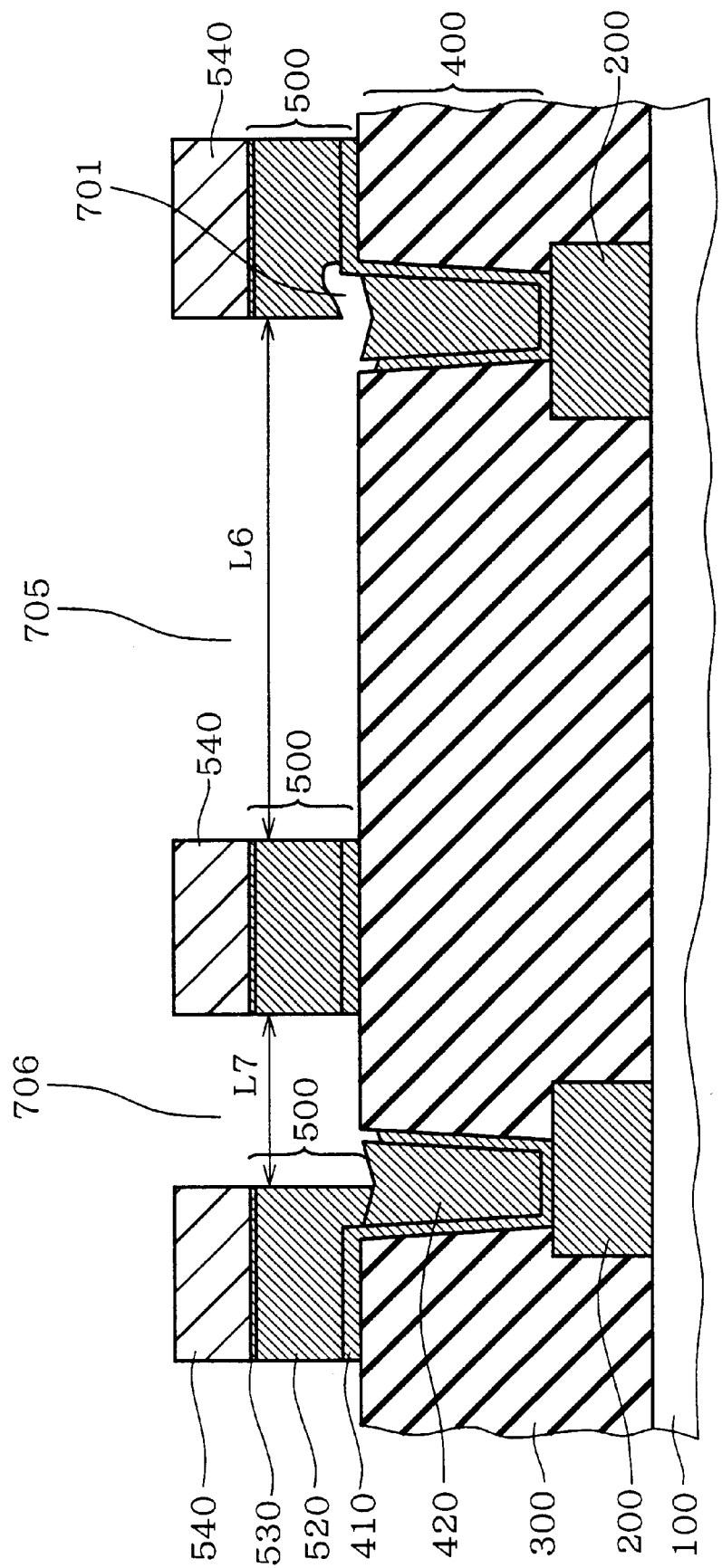
FIG. 55 is a cross-sectional view of a conventional contact structure.

Firstly, a conventional method is described by referring to FIGS. 54 and 55 which show a conventional semiconductor integrate circuit. FIG. 54 is a plan view and FIG. 55 is a cross-sectional view taken on line 55—55 of FIG. 54. In these figures, L6 and L7 designate a distance between two adjacent wire layers 500, and L6 is longer than L7.

As shown in FIGS. 54 and 55, all conductors 400 formed on a semiconductor integrated circuit have a borderless structure. To constitute all the conductors 400 with a borderless structure makes design easy.

However, since L6 is longer than L7, a concave portion 705 has a lower RIE-Lag than a concave portion 706. Therefore, even if the side walls of the wire layer 500 in the concave portion 706 are free from erosion, the wire layer 500 in the concave portion 705 may be eroded to cause disconnection between the conductor 400 and the wire layer 500 in some cases.

In a seventh preferred embodiment of the present invention, a semiconductor integrated circuit is fabricated as shown in FIGS. 36 to 39.

Figure 36:
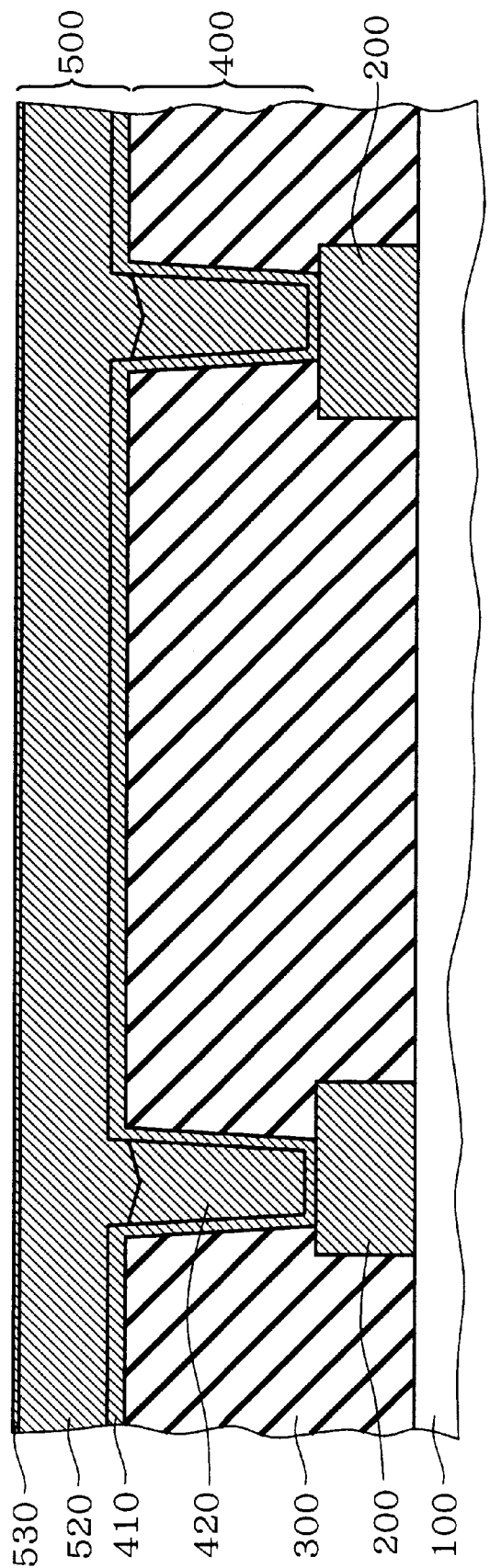
FIGS. 36 and 37 are cross-sectional views showing a sequence of steps in a method for manufacturing a contact structure according to a seventh preferred embodiment of the present invention.

Referring to FIG. 36, a structure similar to that shown in FIG. 27 with respect to the fifth preferred embodiment is obtained. There are two conductors 400, and the recess amount is zero.

Figure 37:
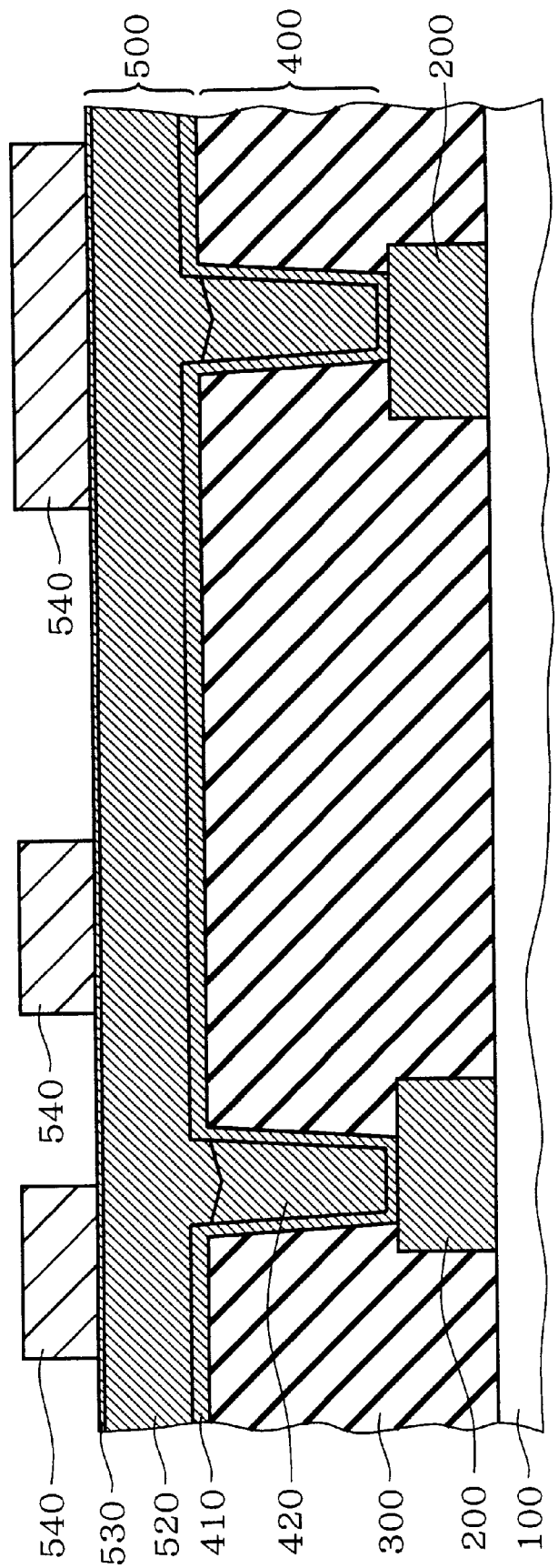

Referring to FIG. 37, a resist 540 is formed on the structure shown in FIG. 36, by using a known technique, and a patterning is conducted.

Figure 38:
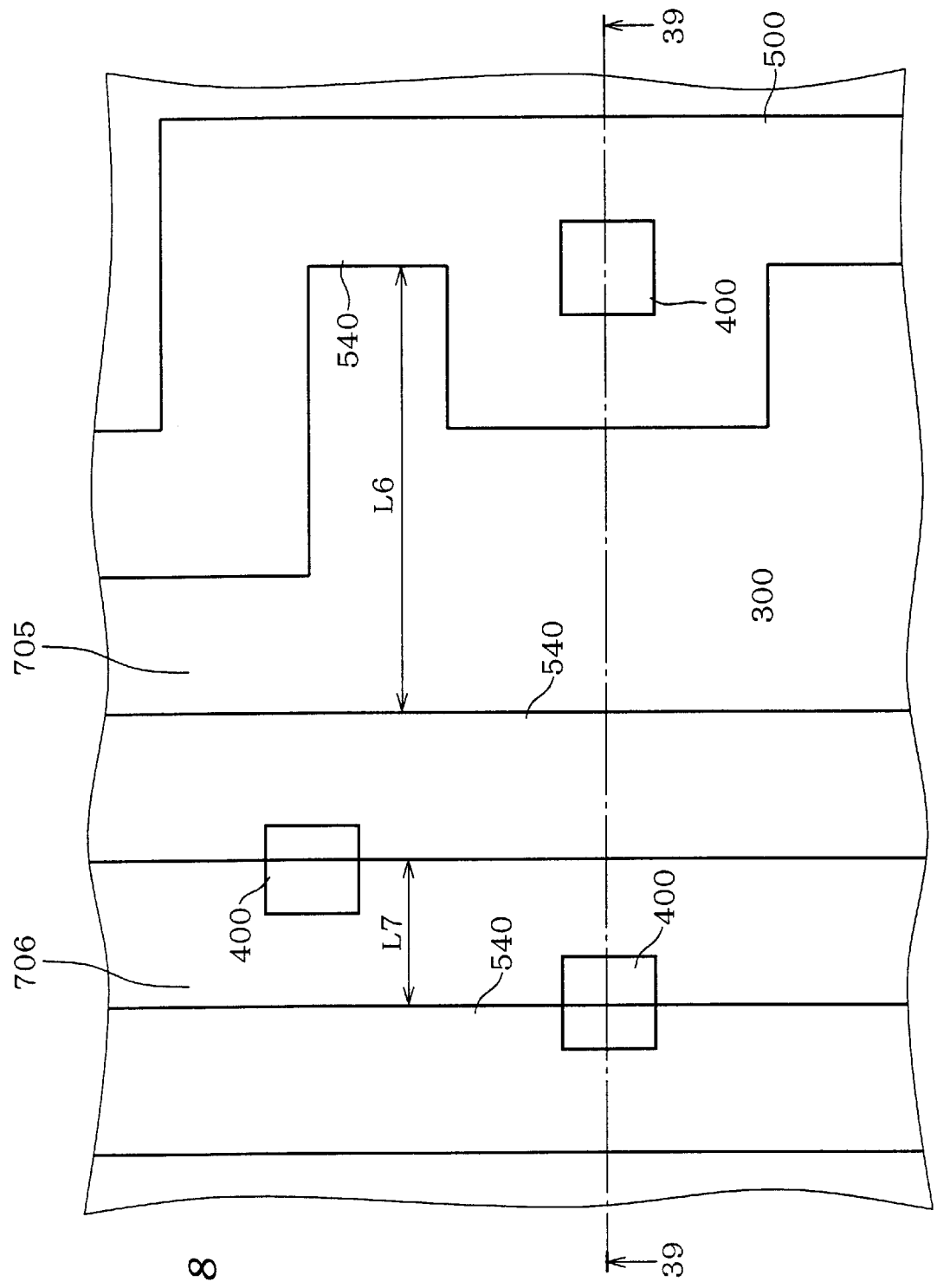
FIG. 38 is a plan view of a contact structure of the seventh preferred embodiment.
Figure 39:
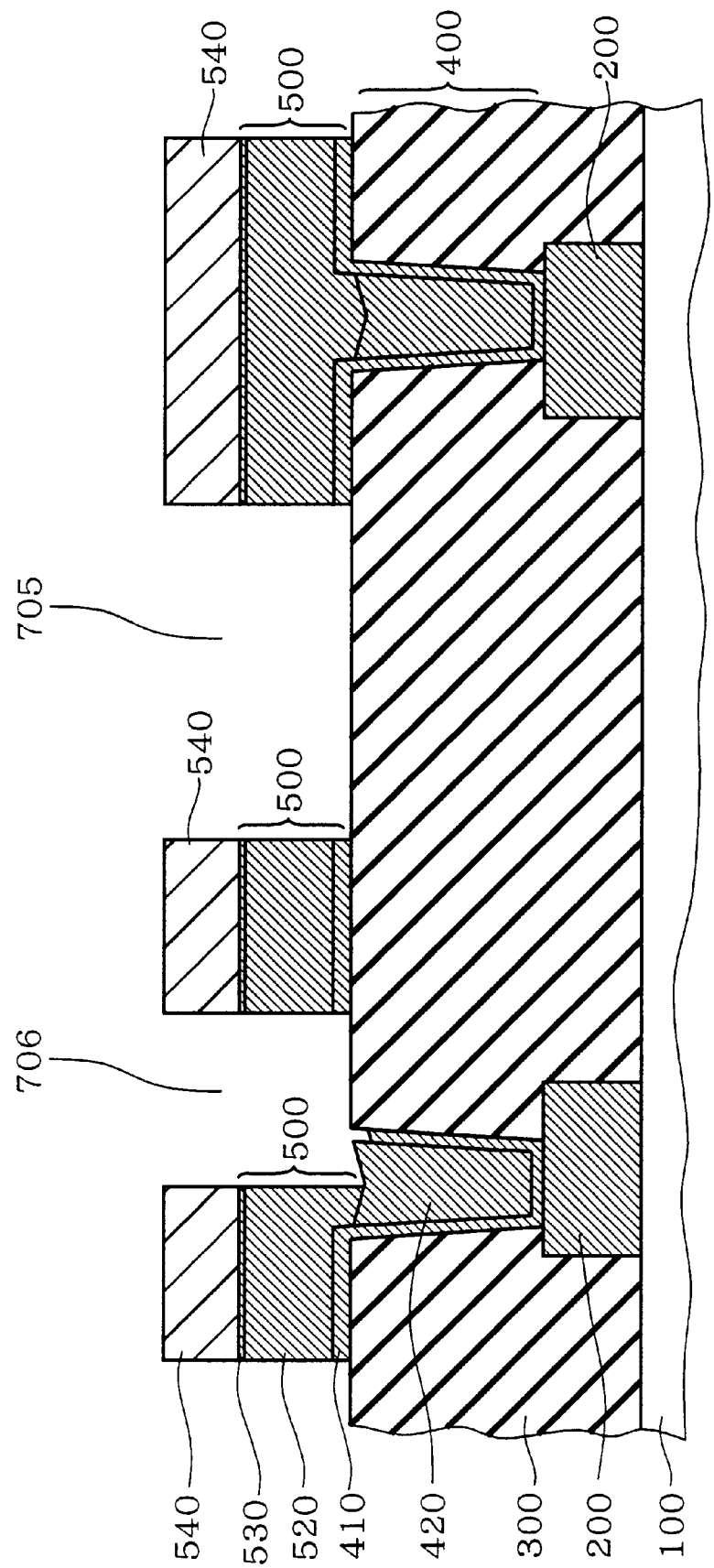
FIG. 39 is a cross-sectional view of a contact structure of the seventh preferred embodiment.

Referring to FIGS. 38 and 39, a wire layer 500 is subjected to a patterning by a dry etching using a mixed gas plasma of $Cl_2$ and $BCl_3$. FIG. 38 is a plan view and FIG. 39 is a cross-sectional view taken on line 39—39 of FIG. 38, wherein either of two parallel wire layers 500 in a concave portion 706 becomes an erosion inhibitor. In FIG. 38, L7 is 0.8 $\mu$m, for example, which is the shortest in the wire intervals on a semiconductor integrated circuit. The etching conditions for the structure shown in FIG. 37 is set so as to avoid erosion in the concave portion 706.

With respect to the conductors 400 in the concave portion 705 as shown in FIGS. 54 and 55, the conductors 400 is completely covered with the wire layer 500 by forming a resist 540 into such a shape that it completely covers the conductor 400, as shown in FIGS. 38 and 39.

Thus, in the seventh preferred embodiment, etching conditions is set so that no erosion occurs in the shortest wire interval among the wire intervals on a semiconductor integrated circuit, and, for conductors 400 spaced apart by a wire interval longer than the shortest one, a resist 540 completely covering the conductors 400 is formed. With this construction, it is possible to prevent disconnection between the wire layer 500 and each conductor 400 on the semiconductor integrated circuit.

Although all the conductors 400 in a longer wire interval than L7 are not necessarily covered with the resist 540, at least the conductor 400 in the longest wire interval on the semiconductor integrated circuit should be covered with the resist 540. With the construction in which the conductor 400 in the shortest wire interval on a semiconductor integrated circuit has a borderless structure, and at least the conductor 400 in the longest wire interval on the circuit is completely covered with the resist 540, it is possible to refine the semiconductor integrated circuit and also maintain the wire reliability to a certain degree.

Eighth Preferred Embodiment

An eighth preferred embodiment of the present invention demonstrates a manufacturing method based on the same concept as in the seventh preferred embodiment. In the seventh preferred embodiment, for a conductor 400 in a longer wire interval than the shortest wire interval on a semiconductor integrated circuit, a resist 540 that completely covers such a conductor 400 is formed, as shown in FIGS. 38 and 39.

Figure 40:
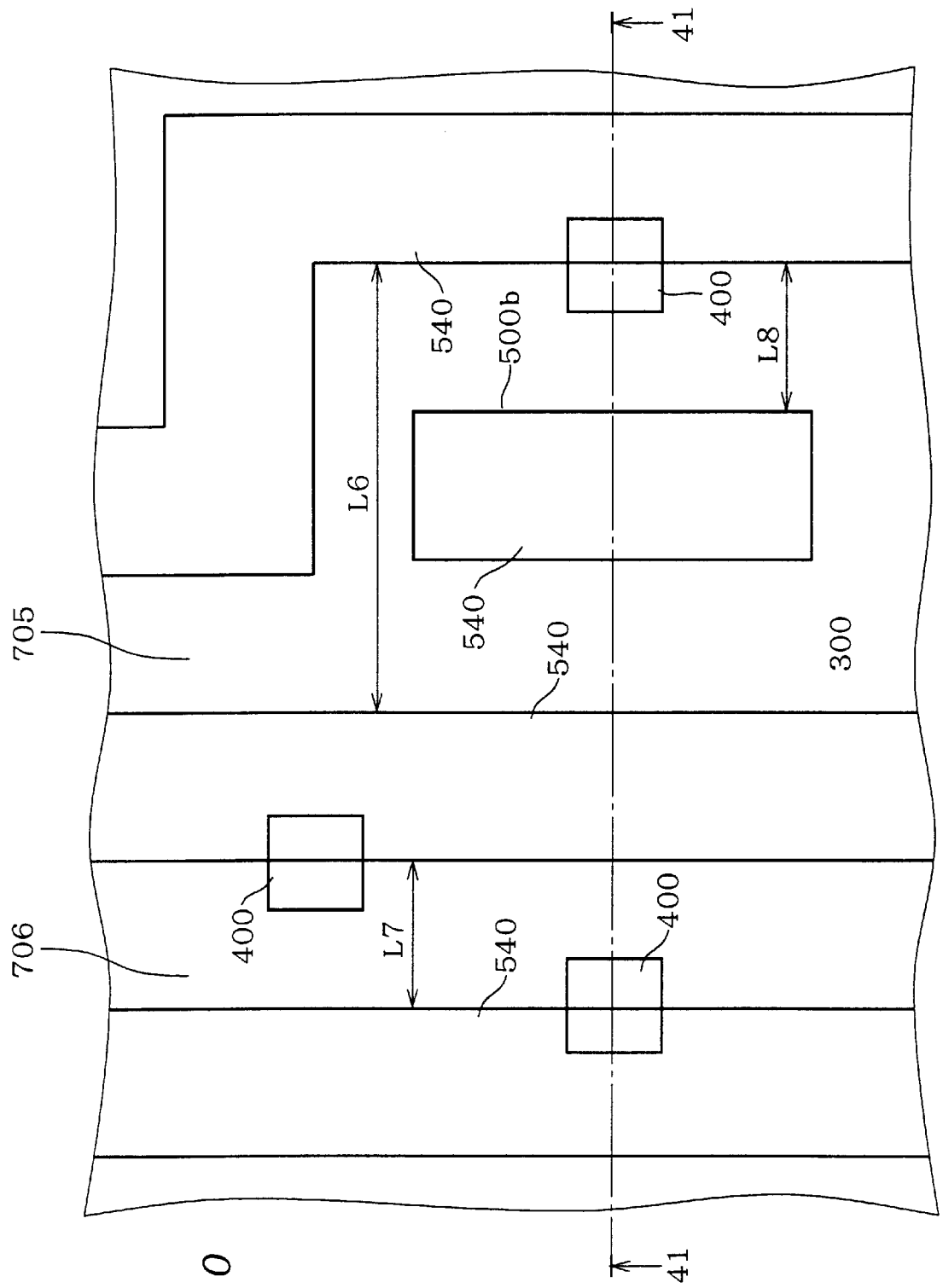
FIG. 40 is a plan view of a contact structure according to an eight preferred embodiment of the present invention.
Figure 41:
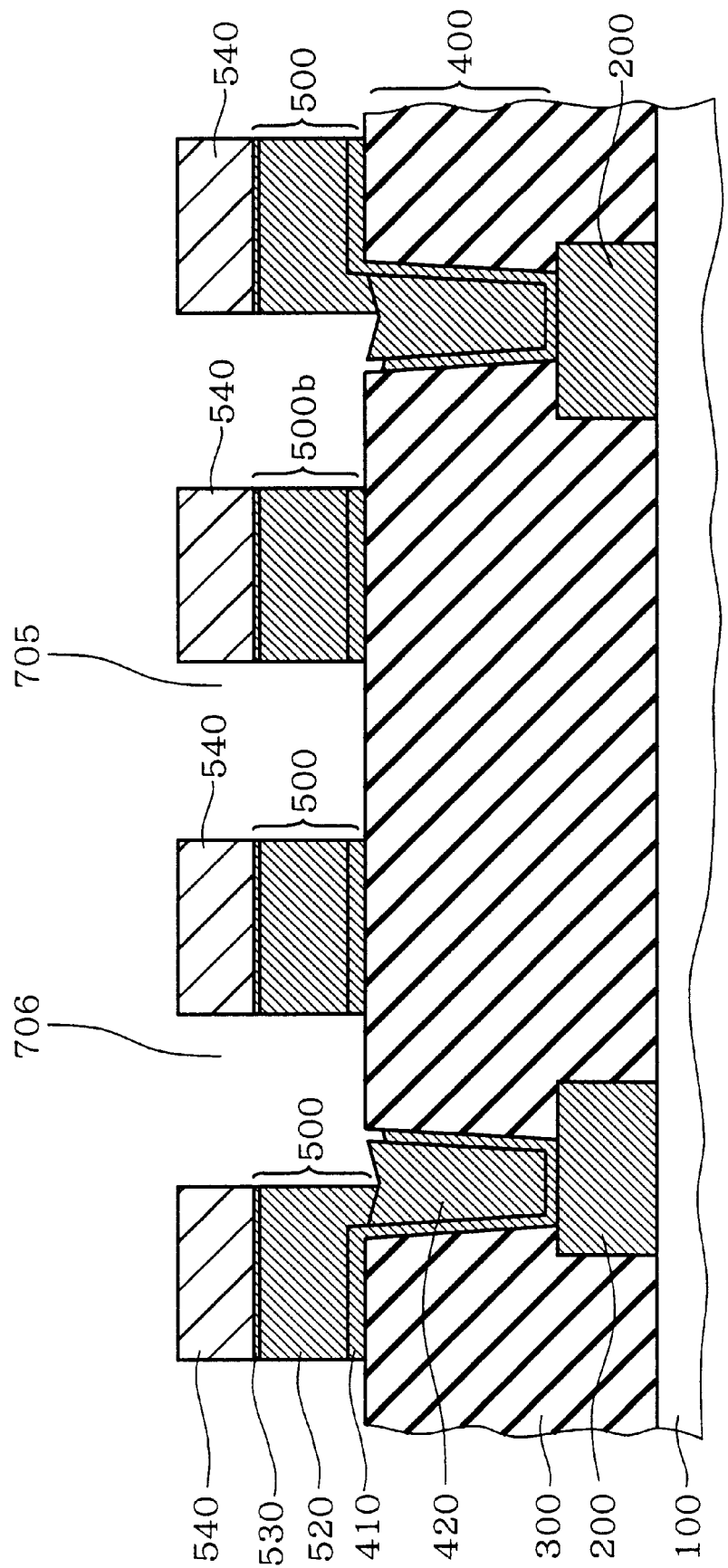
FIG. 41 is a cross-sectional view of a contact structure of the eighth preferred embodiment.

Whereas in the eight preferred embodiment, with respect to a conductor in a longer wire interval than the shortest wire interval on a semiconductor integrated circuit, a resist 540 is formed so that a dummy wire 500b is formed in the vicinity of the conductor 400, as shown in FIGS. 40 and 41, which are a plan view and a cross-sectional view taken on line 41—41 of FIG. 40, respectively. By forming the dummy wire 500b, the wire interval after the dummy wire 500Ob is formed (i.e., L8 in FIG. 40) can be equal to L7. Here, the dummy wire 500b becomes an erosion inhibitor.

Thus, in the eight preferred embodiment, the formation of the dummy wire 500b enables to prevent disconnection between the wire layer 500 and each conductor 400 on the semiconductor integrated circuit.

Ninth Preferred Embodiment

As a wire interval increases, the cross-section of a wire layer 500 has a pronounced taper shape.

Figure 42:
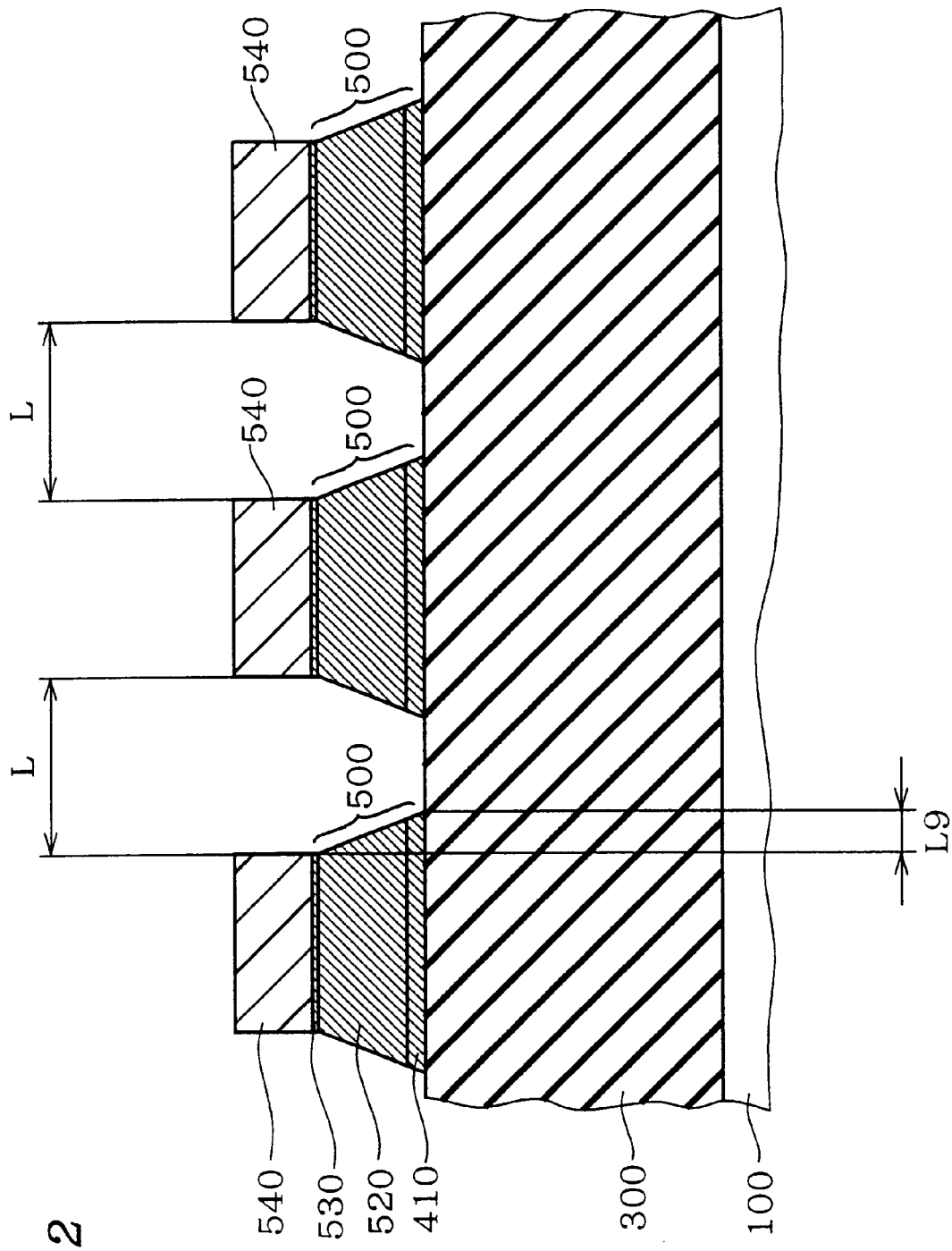
FIG. 42 is a cross-sectional view of a sample used in a ninth preferred embodiment of the present invention.

Referring to FIG. 42, there were prepared three samples in which plural wire layers 500 were aligned at a constant interval L on a base layer 100, and the dimensions of the wire layer 500 were measured. The samples were made by a process for obtaining a desired semiconductor integrated circuit. Each wire width was 0.3 μm, and distance L was 0.3 μm, 1.0 μm and 2.0 μm, respectively. In FIG. 42, L9 designates a distance from the end of the top surface of the wire layer 500 to the end of its bottom surface, when taken from above.

Figure 43:
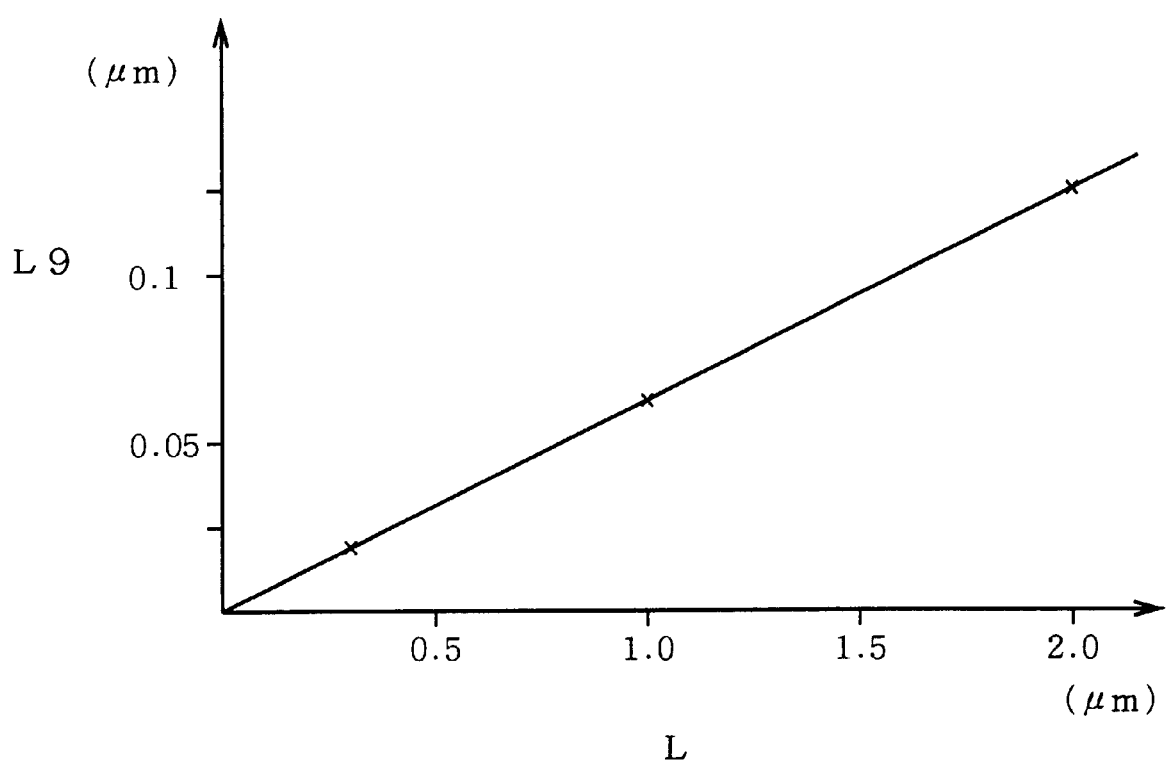
FIG. 43 is a graph showing the characteristics of etching used in the ninth preferred embodiment.

FIG. 43 shows the relations between L and L9. Samples with L of 0.3 μm, 1.0 μm, and 2.0 μm, had L9 of 0.015 μm, 0.06 μm, and 0.125 μm, respectively.

In The ninth preferred embodiment, taking the relations between L and L9 as shown in FIG. 43 into consideration, the conductor 400 in a long wire width is disposed so that it is completely covered with a taper-shaped wire layer 500. This results in the structure as shown in FIGS. 44 and 45.

Figure 44:
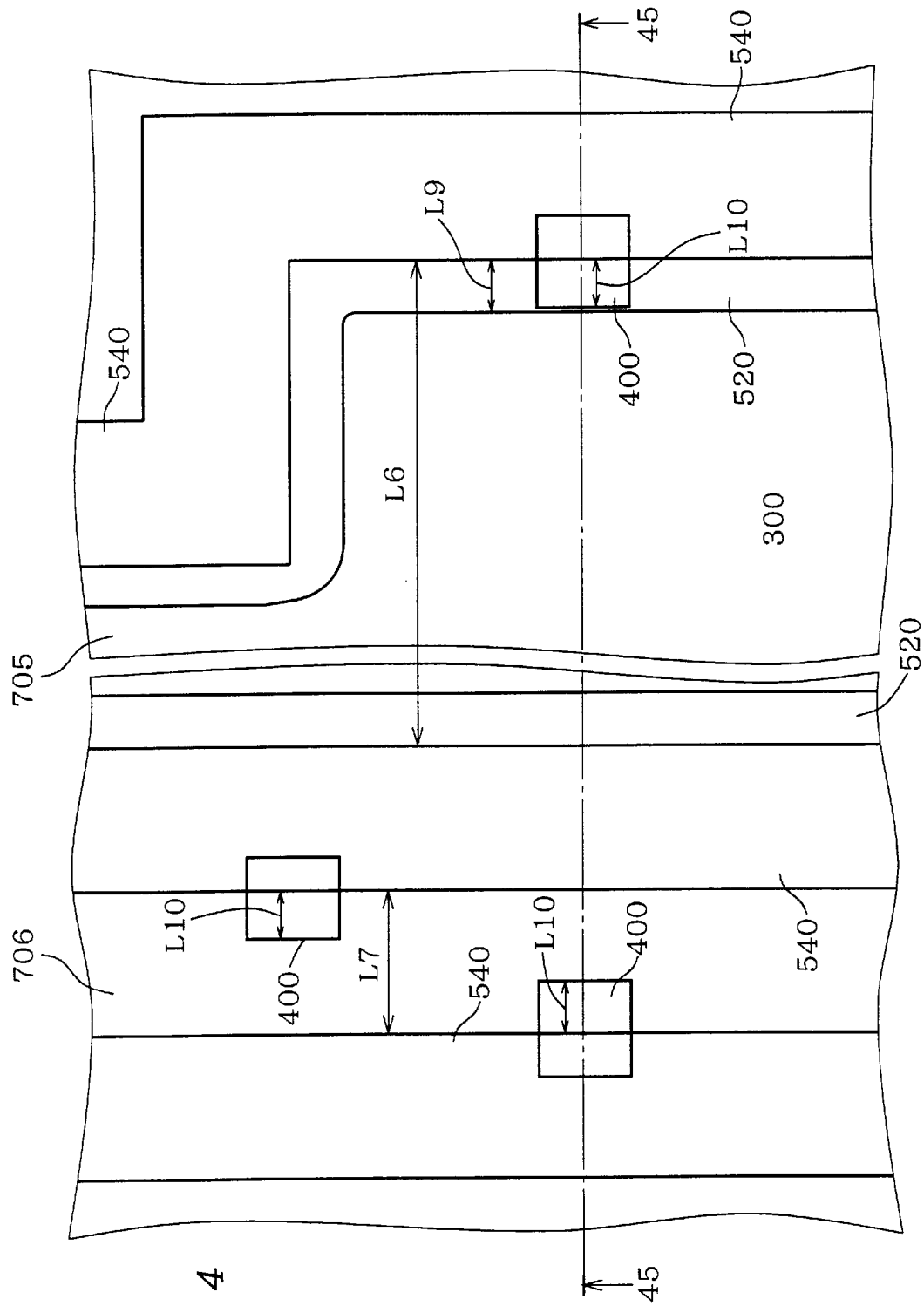
FIG. 44 is a plan view of a contact structure of the ninth preferred embodiment.
Figure 45:
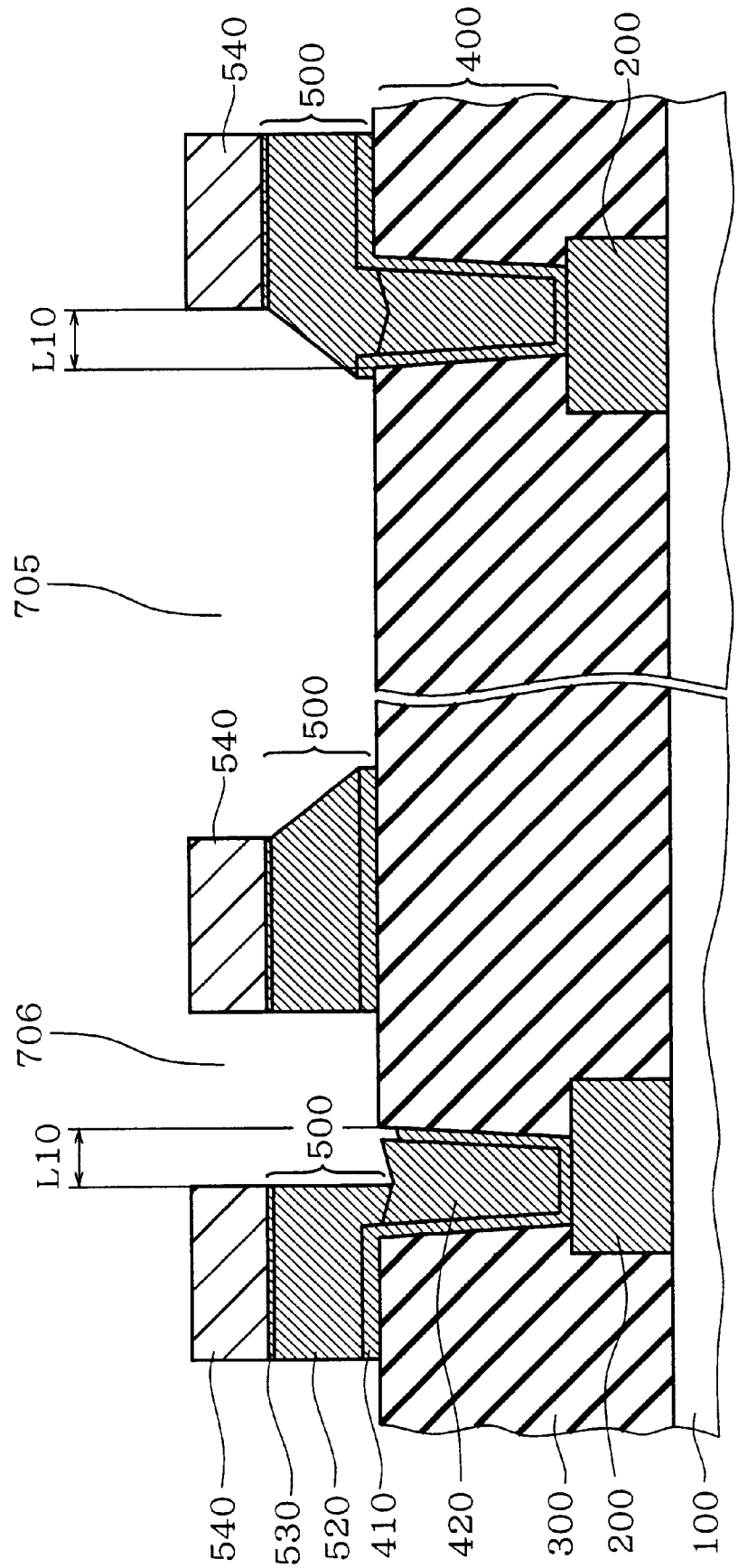
FIG. 45 is a cross-sectional view of a contact structure of the ninth preferred embodiment.

FIG. 44 is a plan view, and FIG. 45 is a cross-sectional view taken on line 45—45 of FIG. 44. In these figures, L10 designates a distance from the end of the top surface of the wire layer 400 to the top surface of the wire layer 500, when taken from above. The configuration of these figures satisfies the requirements that L10 is not more than 0.1 μm and the wire interval is not more than 0.5 μm, or not less than 2.0 μm. In these figures, L7 is not more than 0.5 μm and L6 is not less than 2.0 μm. The conditions in forming the wire layer 500 is set so that no erosion occurs in the wire layer 500 related to the wire width of not more than 0.5 μm. With this configuration, no erosion occurs in the wire layer 500 in a concave portion 706. As to the wire layer 500 in a concave portion 705, since L9 is longer than L10 based on the characteristics shown in FIG. 43, the conductor 400 is covered this wire layer 500, thus being free from erosion.

In cases where it is difficult to make a wire interval not more than 0.5 μm, such a wire interval is attained easily by employing a dummy wire, as stated in the eighth preferred embodiment.

The etching conditions of a wire layer 500 for obtaining a taper-shape is as follows. As a resist 540, an eximer resist, an i line resist, or a g line resist is used. Alternatively, a resist 540 may be a multi-layered structure comprising an inorganic based film (e.g., $SiO_2$, SiON, or $Si_3N_4$) and another inorganic film (e.g., an eximer resist, i line resist, or g line resist). Alternatively, a resist 540 may be a multi-layered stricture comprising an organic based antireflection layer and an eximer resist. As an etching system, there can be employed the ICP type etching system, the ECR type etching system, the parallel flat-plate type RIE system, MERIE system, or the like. As gas for etching, there may be used a mixed gas of $Cl_2$, $BCl_3$, and $CHF_3$, or the like.

Thus, in the ninth preferred embodiment, by employing two types of wire intervals: a short one causing no side etch; and a long one in which a taper-shaped wire completely covers a conductor 400, it is possible to prevent disconnection between a wire layer 500 and each conductor on a semiconductor integrated circuit.

Tenth Preferred Embodiment

Figure 46:
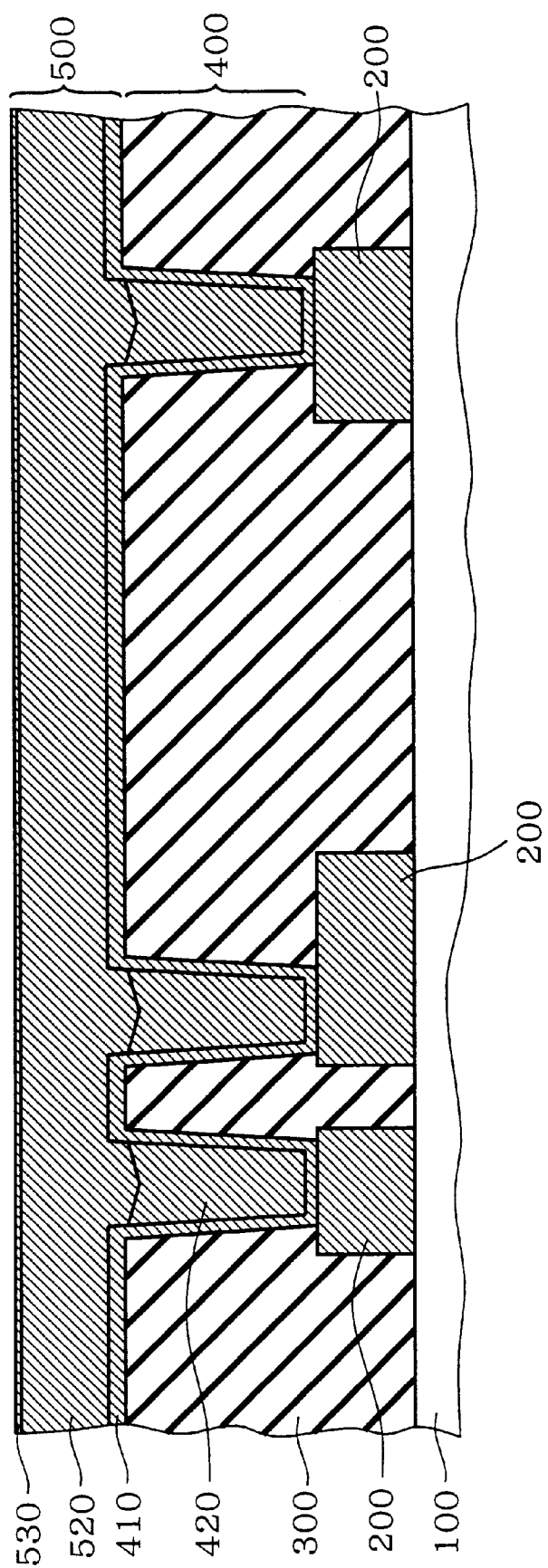
FIGS. 46 to 48 are cross-sectional views showing a sequence of steps in a method for manufacturing a contact structure according to a tenth preferred embodiment of the present invention.

Referring to FIG. 46, a structure similar to that shown in FIG. 27 with respect to the fifth preferred embodiment is obtained. There are three conductors 400, and the recess amount is zero.

Figure 47:
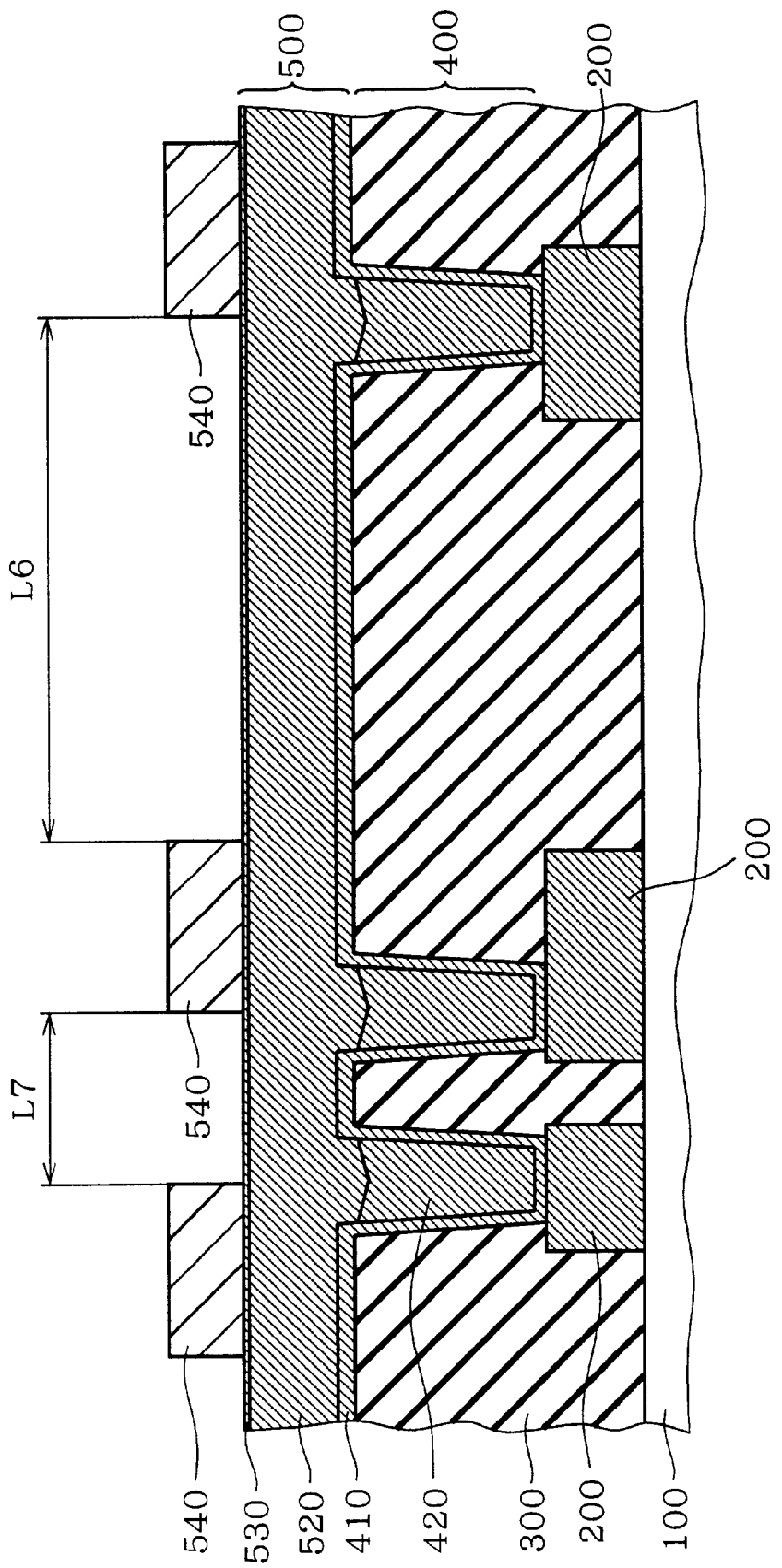

Referring to FIG. 47, a resist 540 is formed on the structure shown in FIG. 46, by a known technique, and a puttering is then conducted. In FIG. 47, L6 is 1.0 μm and L7 is 0.4 μm.

Figure 48:
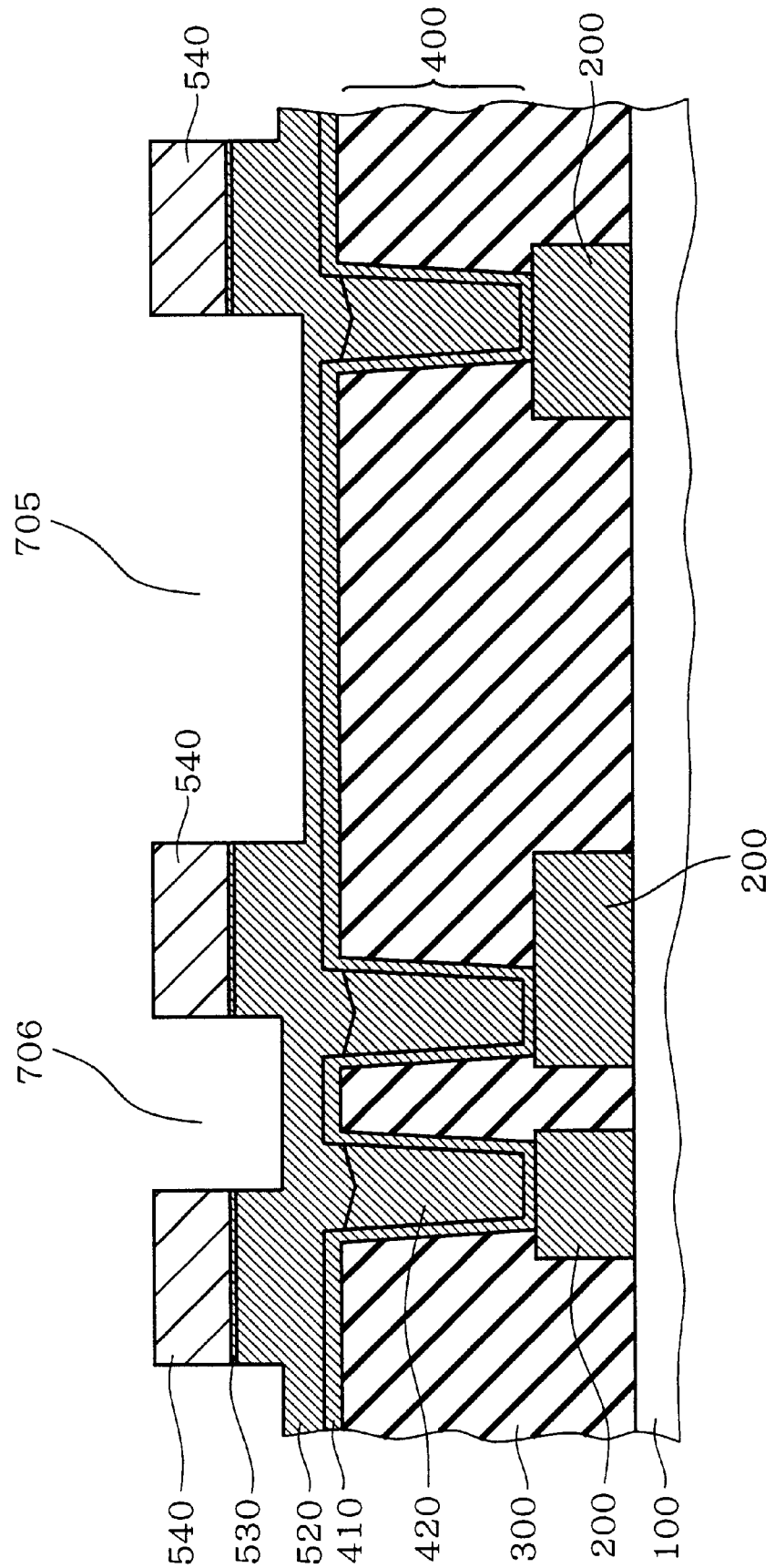
Figure 51:
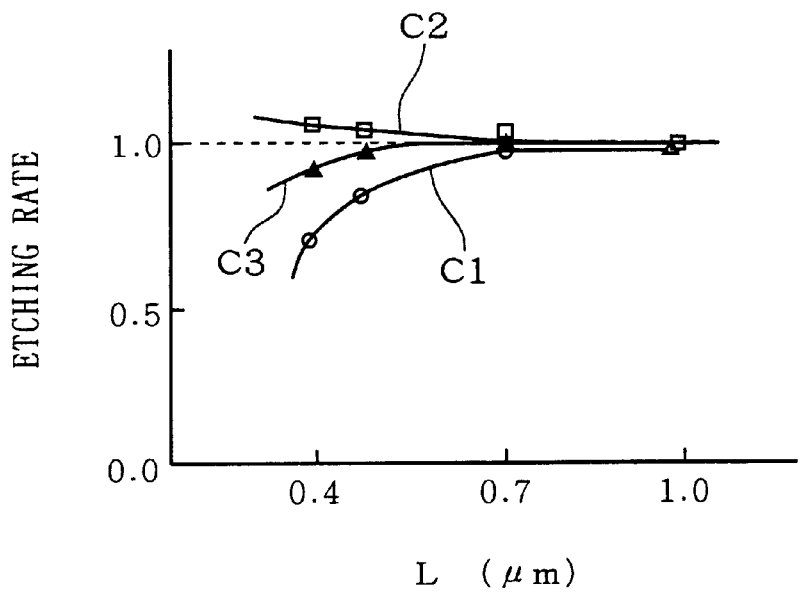
FIG. 51 is a graph showing the characteristics of etching used in the tenth preferred embodiment.
Figure 52:
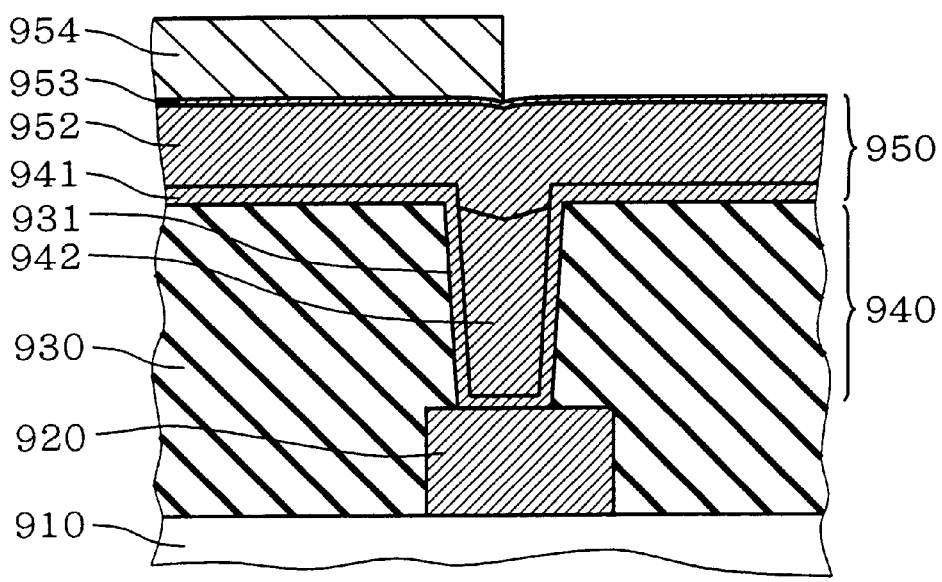
FIG. 52 is a cross-sectional view of a conventional method for manufacturing a contact structure.
Figure 53:
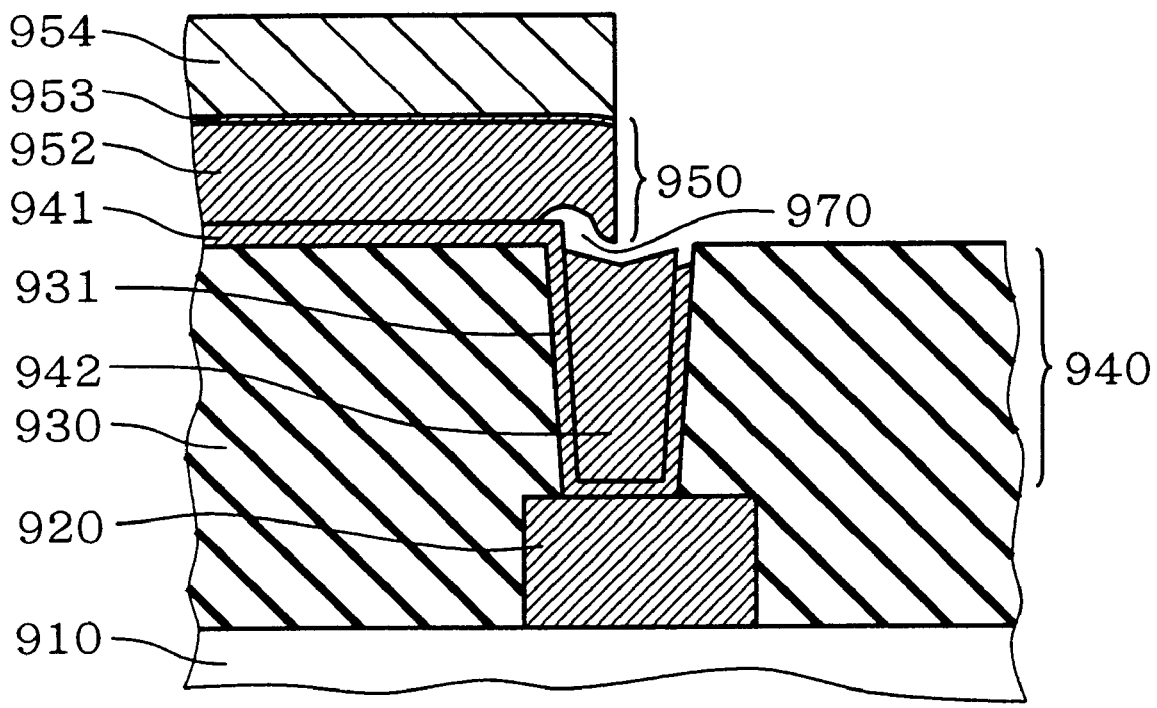
FIG. 53 is a cross-sectional view of a conventional contact structure.

Referring to FIG. 48, an antireflection layer 530 and an aluminum wire layer 520 are subjected to a patterning by a dry etching using a chlorine based gas, e.g., a mixed gas of $Cl_2$ and $BCl_3$, under the conditions that a gas pressure is 10–100 mTorr and a total flow of this gas is 100–300 sccm. In this case, as shown curve C1 in FIG. 51, the etching rate of a concave portion 706 having a wire interval of 0.4 μm is lower than that of a concave portion 705. Therefore, the aluminum wire layer 520 in the concave portion 706 is thicker than the aluminum wire layer 520 in the concave portion 705.

Figure 49:
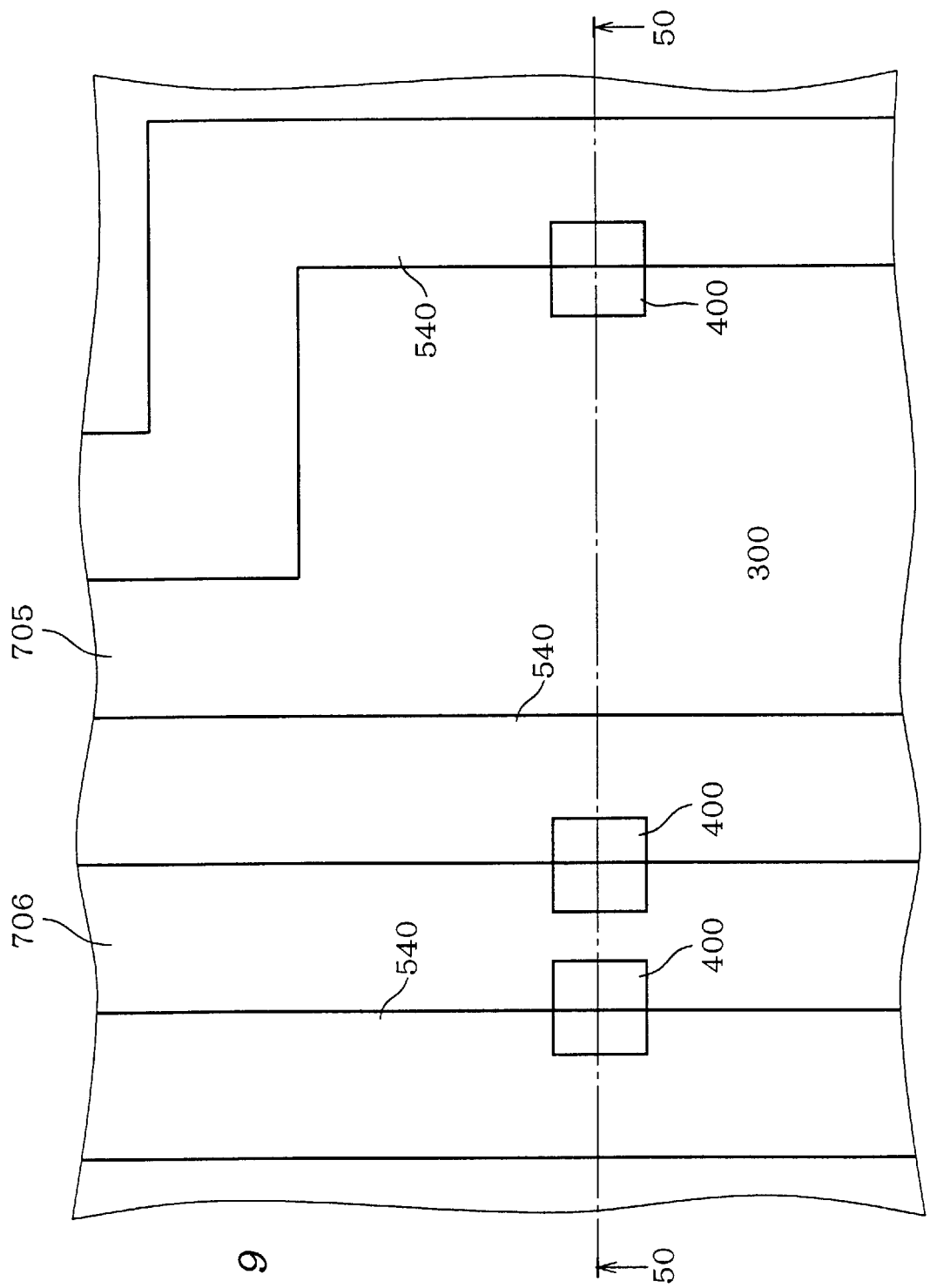
FIG. 49 is a plan view of a contact structure of the tenth preferred embodiment.
Figure 50:
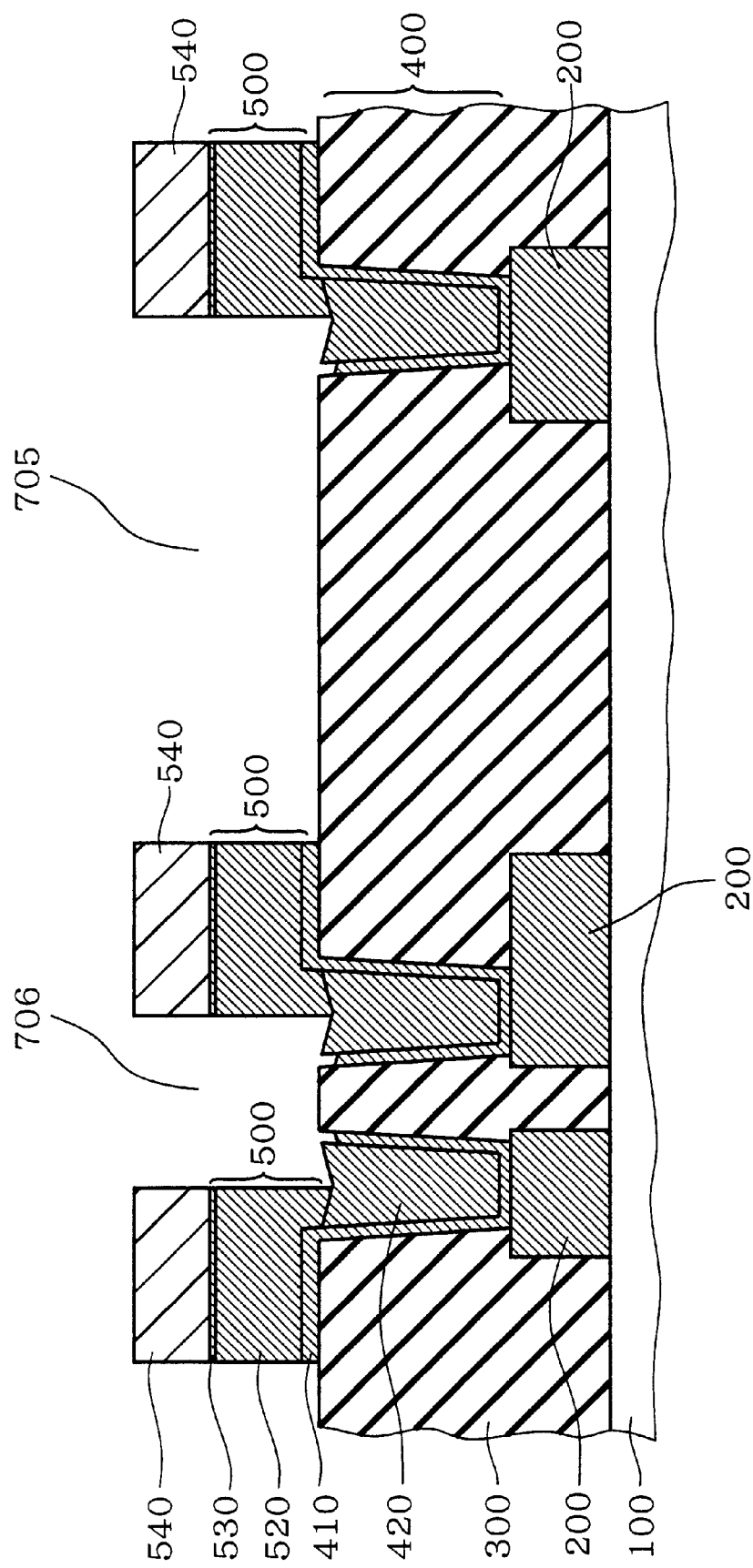
FIG. 50 is a cross-sectional view of a contact structure of the tenth preferred embodiment.

For this, a chlorofuoro hydrocarbon based gas, e.g., $CHF_3$, $CH_2F_2$, $CH_3F_6$, and $C_3F_6C_4F_8$, is added into a reaction chamber. The total flow of the chlorofuoro hydrocarbon based gas is not less than 10% nor more than 50%, to the total flow of the above chlorine based gas. As shown in curve C2 in FIG. 51, the etching rate of the concave portion 706 with the wire interval of 0.4 μm is higher than that of the concave portion 705. Consequently, the wire layers 500 in the concave portions 705 and 706 are eroded at a similar speed, so that the aluminum wire layer 520 and the barrier metal layer 410 are removed in the concave portions 705 and 706 at the same time, as shown in FIGS. 49 and 50. FIG. 49 is a plan view and FIG. 50 is a cross-section taken on line 50—50 of FIG. 49. In these figures, either of two parallel wire layers 500 in the concave portion 706 becomes an erosion inhibitor, and either of two parallel wire layers 500 in the concave portion 705 becomes an erosion inhibitor.

The chlorofuoro hydrocarbon based gas may be replaced with $N_2$ gas. When $N_2$ gas is used as gas for deposition, the etching rate of the concave portion 706 with the wire interval of 0.4 $\mu$m is not increased than that of the concave portion 705. Therefore, after the barrier metal layer 410 and the aluminum wire layer 520 which are left in the concave portion 705 are completely removed, the barrier metal layer 410 and the aluminum wire layer 520 which are left in the concave portion 706 are completely removed. Compared to cases where the above chlorine based gas alone, or the combination of the chlorine based gas and the chlorofuoro hydrocarbon based gas is used, the use of $N_2$ gas as gas for deposition produces a strong side wall protection film, which is formed by that a product, e.g. $AlCl_x$, generated by the etching of the aluminum wire layer 520, deposits on the side wall of the wire layer 500. Therefore, although the side walls of the wire layer 500 in the concave portion 705 have a chance to receive etching, they are not eroded because of the strong side wall protection film until the barrier metal layer 410 and the aluminum wire layer 520 left in the concave portion 705 are completed removed, and then the layers 420 and 520 left in the concave portion 706 are completely removed.

Thus, in the tenth preferred embodiment, in the patterning of the wire layer 500, the etching in a short wire interval is conducted by two types of etchings, one of which has a higher etching rate and the other has a lower etching rate, compared to the etching rate in a long wire interval. It is therefore possible to complete the removal in the long wire interval and the removal in the small wire interval at the same time, preventing the side walls of the wire layer 500 from being eroded.

With an etching using $N_2$ gas, the removal in the long wire interval is completed earlier than the removal in the short wire interval, however, a strong side wall protection film remains on the side walls of the wire layer 500 until the removal in the short wire interval is completed. Therefore, the side walls of the wire layer 500 is free from erosion.

While the invention has been shown and described in detail, the foregoing description is in all aspects illustrative and not restrictive. It is therefore understood that numerous modifications and variations can be devised without departing from the scope of the invention.

We claim:

1. A method for manufacturing a contact structure comprising the steps of:
   (a) forming an insulating film having a wire burying hole;
   (b) forming a conductor buried in said wire burying hole;
   (c) forming a wire layer covering said wire burying hole, on said insulting film;
   (d) trimming said wire layer by etching so that it does not cover part of said wire burying hole; and
   (e) conducting a heat treatment for a structure obtained after said step (c), to form a region between said conductor and said wire layer in which said conductor and said wire layer are mutually diffused, as an erosion inhibitor for inhibiting erosion of said wire layer.

2. The method for forming a contact structure as defined in claim 1 wherein said conductor includes a tungsten plug and said wire layer includes an aluminum wire layer.

3. A method for manufacturing a contact structure comprising the steps of:
   (a) forming an insulating film having a wire burying hole;
   (b) forming a conductor buried in said wire burying hole;
   (c) removing a surface of said insulating film so that a top end of said conductor is located above a top surface of said insulating film;
   (d) forming a wire layer covering said wire burying hole, on said insulting film; and
   (e) trimming said wire layer by etching so that it does not cover part of said wire burying hole,
      wherein part of said conductor projecting from a top surface of said insulating film is an erosion inhibitor for inhibiting erosion of said wire layer.

4. The method for forming a contact structure as defined in claim 3, wherein said conductor includes a tungsten plug and said wire layer includes an aluminum wire layer.

5. A method for manufacturing a contact structure comprising the steps of:
   (a) forming an insulating film having a wire burying hole;
   (b) forming a conductor buried in said wire burying hole;
   (c) forming a first wire layer covering said wire burying hole, on said insulting film; and
   (d) trimming said first wire layer by etching so that it does not cover part of said wire burying hole,
      wherein the trimming step (d) includes the step (e) of forming a second wire layer parallel to said first wire layer as an erosion inhibitor for inhibiting erosion of the first wire layer, and
      wherein a wire interval between said first wire layer and said second wire layer is the shortest in wire intervals on a semiconductor integrated circuit on which said contact structure is provided.

6. The method for forming a contact structure as defined in claim 5, wherein said conductor includes a tungsten plug and said first and second wire layers include aluminum wire layers.

7. A method for manufacturing a contact structure comprising the steps of:
   (a) forming an insulating film having a wire burying hole;
   (b) forming a conductor buried in said wire burying hole;
   (c) forming a wire layer covering said wire burying hole, on said insulting film; and
   (d) trimming said wire layer by etching so that it does not cover part of said wire burying hole,
      wherein the trimming step (d) includes the step (e) of forming a dummy wire parallel to said wire layer as an erosion inhibitor for inhibiting erosion of the wire layer.

8. The method for forming a contact structure as defined in claim 7, wherein said conductor includes a tungsten plug and said wire layer includes an aluminum wire layer.

9. A method for manufacturing a contact structure comprising the steps of:
   (a) forming an insulating film having a wire burying hole;
   (b) forming a conductor buried in said wire burying hole;
   (c) forming a first wire layer covering said wire burying hole, on said insulting film; and
   (d) trimming said first wire layer by etching so that it does not cover part of said wire burying hole,
      wherein said step (d) includes the step (e) of forming a second wire layer parallel to said first wire layer as an erosion inhibitor for inhibiting erosion of the first wire layer, and wherein said etching includes two types of etchings for a longest wire interval, one of which has a higher etching rate and the other has a lower etching rate, than an etching rate in a shortest wire interval.

10. The method for forming a contact structure as defined in claim 9, wherein said conductor includes a tungsten plug and said wire layer includes an aluminum wire layer.

11. A method for manufacturing a contact structure comprising the steps of:

(a) forming an insulating film having a wire burying hole;

(b) forming a conductor buried in said wire burying hole;

(c) forming a first wire layer covering said wire burying hole, on said insulting film; and (d) trimming said first wire layer by etching so that it does not cover part of said wire burying hole, wherein the trimming step (d) includes the step (e) of forming a second wire layer parallel to said first wire layer as an erosion inhibitor for inhibiting erosion of the first wire layer, and wherein said etching comprises an etching using an etching gas that contains nitrogen, and an etching whose etching rate in a longest wire interval is higher than an etching rate in a shortest wire interval.

12. The method for forming a contact structure as defined in claim 11, wherein said conductor includes a tungsten plug and said wire layer includes an aluminum wire layer.

13. A method for manufacturing a contact structure comprising the steps of:

(a) forming an insulating film having a wire burying hole;

(b) forming a conductor buried in said wire burying hole;

(c) forming a wire layer covering said wire burying hole, on said insulating film; and (d) trimming said wire layer by etching so that it does not cover part of said wire burying hole, wherein an erosion inhibitor for inhibiting erosion of said wire layer is formed in a contact area between said conductor and said wire layer, wherein said step (b) includes step (e) of removing a surface of said conductor so that a top end of said conductor is located below a top surface of said insulating film, and wherein said erosion inhibitor is said wire layer filled in said wire burying hole.

* * * * *